(12) United States Patent
Kim et al.

(10) Patent No.: US 12,349,517 B2
(45) Date of Patent: Jul. 1, 2025

(54) CHIP-SCALE PACKAGE LIGHT EMITTING DIODE

(71) Applicant: SEOUL VIOSYS CO., LTD., Ansan-si (KR)

(72) Inventors: Jong Kyu Kim, Ansan-si (KR); Min Woo Kang, Ansan-si (KR); Se Hee Oh, Ansan-si (KR); Hyoung Jin Lim, Ansan-si (KR)

(73) Assignee: SEOUL VIOSYS CO., LTD., Ansan-si (KR)

(*) Notice: Subject to any disclaimer, the term of this patent is extended or adjusted under 35 U.S.C. 154(b) by 0 days.

(21) Appl. No.: 18/449,179

(22) Filed: Aug. 14, 2023

(65) Prior Publication Data

US 2024/0055563 A1    Feb. 15, 2024

Related U.S. Application Data

(60) Continuation of application No. 18/153,205, filed on Jan. 11, 2023, now Pat. No. 11,862,455, which is a (Continued)

(30) Foreign Application Priority Data

Dec. 22, 2017  (KR) .................. 10-2017-0178222
Dec. 6, 2018   (KR) .................. 10-2018-0156201

(51) Int. Cl.
*H10H 20/831* (2025.01)
*H10H 20/819* (2025.01)
(Continued)

(52) U.S. Cl.
CPC ...... *H10H 20/8312* (2025.01); *H10H 20/819* (2025.01); *H10H 20/835* (2025.01); *H10H 20/84* (2025.01); *H10H 20/825* (2025.01)

(58) Field of Classification Search
CPC ..... H01L 33/382; H01L 33/20; H01L 33/405; H01L 33/44; H01L 33/32; H10H 20/8312;
(Continued)

(56) References Cited

U.S. PATENT DOCUMENTS 10,998,469 B2   5/2021   Kim et al.
11,557,696 B2   1/2023   Kim et al.
(Continued)

FOREIGN PATENT DOCUMENTS

CN    102969414      3/2013
CN    106663723 A    5/2017
(Continued)

OTHER PUBLICATIONS

First Examination Report issued to India counterpart Application No. 202037030947, mailed Jul. 13, 2021, 8 pages.
(Continued)

*Primary Examiner* — Samuel A Gebremariam
(74) *Attorney, Agent, or Firm* — Perkins Coie LLP

(57) ABSTRACT

A chip-scale package type light emitting diode includes a first conductivity type semiconductor layer, a mesa, a second conductivity type semiconductor layer, a transparent conductive oxide layer, a dielectric layer, a lower insulation layer, a first pad metal layer, and a second pad metal layer, an upper insulation layer. The upper insulation layer covers the first pad metal layer and the second pad metal layer, and includes a first opening exposing the first pad metal layer and a second opening exposing the second pad metal layer. The openings of the dielectric layer include openings that have different sizes from one another.

20 Claims, 13 Drawing Sheets

Related U.S. Application Data continuation of application No. 17/157,600, filed on Jan. 25, 2021, now Pat. No. 11,557,696, which is a division of application No. 16/885,536, filed on May 28, 2020, now Pat. No. 10,998,469, which is a continuation of application No. PCT/KR2018/015628, filed on Dec. 10, 2018.

(51) Int. Cl.
*H10H 20/832* (2025.01)
*H10H 20/84* (2025.01)
*H10H 20/825* (2025.01)

(58) Field of Classification Search
CPC ............... H10H 20/819; H10H 20/835; H10H 20/8314; H10H 20/8316; H10H 20/814
See application file for complete search history.

(56) References Cited

U.S. PATENT DOCUMENTS

| | | | | |
|---|---|---|---|---|
| 11,862,455 | B2* | 1/2024 | Kim | ............. H01L 33/382 |
| 2010/0117111 | A1 | 5/2010 | Illek et al. | |
| 2013/0049053 | A1 | 2/2013 | Kususe et al. | |
| 2016/0013388 | A1 | 1/2016 | Lee et al. | |
| 2016/0225956 | A1 | 8/2016 | Kawai et al. | |
| 2016/0247971 | A1* | 8/2016 | Lee | ............. H01L 33/382 |
| 2020/0295229 | A1 | 9/2020 | Kim et al. | |
| 2021/0151628 | A1 | 5/2021 | Kim et al. | |

FOREIGN PATENT DOCUMENTS

| | | |
|---|---|---|
| JP | 2001358371 | 12/2001 |
| JP | 2009164423 A | 7/2009 |
| KR | 1020160116778 A | 10/2016 |
| KR | 1020170009359 A | 1/2017 |
| KR | 1020170046113 | 4/2017 |
| KR | 1020170046113 A | 4/2017 |
| WO | 2017/138707 A1 | 8/2017 |

OTHER PUBLICATIONS

English translation of Office Action issued on Sep. 15, 2021, in counterpart Chinese Application No. 201880005632.3, 18 pages.
International Search Report for International Application No. PCT/KR2018/015628, mailed Mar. 15, 2019.
Search Report from corresponding European Patent Application No. EP23208095, dated Mar. 26, 2024.

* cited by examiner

CHIP-SCALE PACKAGE LIGHT EMITTING DIODE

CROSS-REFERENCE TO RELATED APPLICATIONS

This application is a continuation of U.S. patent application Ser. No. 18/153,205, filed on Jan. 11, 2023, which is a continuation of U.S. application Ser. No. 17/157,600, filed on Jan. 25, 2021, which is a divisional of U.S. application Ser. No. 16/885,536, filed on May 28, 2020, which is a continuation of PCT Application No. PCT/KR2018/015628, filed on Dec. 10, 2018, which claims the benefit and priority to Korean Patent Application No. 10-2018-0156201, filed on Dec. 6, 2018, and Korean Patent Application No. 10-2017-0178222, filed on Dec. 22, 2017. The disclosures of all of the above-referenced applications are hereby incorporated by reference in their entireties.

TECHNICAL FIELD

Embodiments of the present disclosure relate to a light emitting diode, more specifically to a chip-scale package type light emitting diode.

BACKGROUND

In general, with good thermal stability and a direct transition type energy band structure, Group III-based nitrides, such as gallium nitride (GaN), aluminum nitride (AlN), and the like, have been in the spotlight as materials for light sources in the visible range and the ultraviolet range. In particular, blue and green light emitting diodes using indium gallium nitride are used in various fields that include large full color flat panel displays, signal lamps, interior lighting, high density light sources, high resolution output systems, optical communication, and the like.

In recent years, research on a chip-scale package type light emitting diode, in particular, a packaging process performed at a chip level, has been underway. Since these light emitting diodes are smaller in size than standard packages and do not require a separate packaging process, manufacturing processes can further be simplified, and time and cost can be saved.

The chip-scale package type light emitting diode has a flip-chip shape electrode structure in general, and an ohmic reflection layer is used to emit light toward a substrate. Since the flip chip shape electrode structure is included, it is possible to provide a light emitting diode having excellent luminous efficiency and heat dissipation characteristics. However, the light emitting diode may be defective because solder may diffuse into the light emitting diode and contaminate an ohmic reflection layer.

Accordingly, there is a need to provide a reliable light emitting diode while simplifying the structure of the light emitting diode.

It is preferable that the chip-scale package type light emitting diode has strong resistance to electrical overstress or electrostatic discharge because a separate protection device against electrical overstress or electrostatic discharge may not be available.

SUMMARY

Exemplary embodiments provide a light emitting diode that may effectively prevent diffusion of a bonding material such as solder, thereby improving reliability of the light emitting diode. Exemplary embodiments also provide a chip-scale package light emitting diode that has a reflective structure having high reflectance. Exemplary embodiments further provide a chip-scale package light emitting diode that is resistant to electrical overstress or electrostatic discharge.

A light emitting diode according to an exemplary embodiment includes: a first conductivity type semiconductor layer; a mesa, a second conductivity type semiconductor layer, a transparent conductive oxide layer, and a dielectric layer. The mesa is disposed on the first conductivity type semiconductor layer and includes an active layer and a second conductivity type semiconductor layer. The transparent conductive oxide layer is disposed on the mesa and electrically connected to the second conductivity type semiconductor layer. The dielectric layer covers the conductive oxide layer, and includes a plurality of openings exposing the conductive oxide layer.

The light emitting diode further includes a metal reflection layer, a lower insulating layer, a first pad metal layer, a second pad metal layer, and an upper insulation layer. The metal reflection layer is disposed on the dielectric layer, and connecting to the conductive oxide layer through the openings of the dielectric layer. The lower insulation layer covers the mesa and the metal reflection layer, and includes at least one first opening exposing the first conductivity type semiconductor layer and a second opening exposing the metal reflection layer. The first pad metal layer is disposed on the lower insulation layer, and electrically connected to the first conductivity type semiconductor layer through the at least one first opening. The second pad metal layer is disposed on the lower insulation layer, and electrically connected to the metal reflection layer through the second opening. The upper insulation layer covers the first pad metal layer and the second pad metal layer, and includes a first opening exposing the first pad metal layer and a second opening exposing the second pad metal layer. The openings of the dielectric layer include a narrow and elongated bar-shaped opening adjacent to at least one of the first openings of the lower insulation layer.

A light emitting diode according to another exemplary embodiment includes: a first conductivity type semiconductor layer; a mesa, a second conductivity type semiconductor layer, a transparent conductive oxide layer, a dielectric layer, a lower insulation layer, and a metal reflection layer. The mesa is disposed on the first conductivity type semiconductor layer, and including an active layer and a second conductivity type semiconductor layer. The transparent conductive oxide layer is disposed on the mesa and electrically connected to the second conductivity type semiconductor layer. The dielectric layer covers the conductive oxide layer, and includes a plurality of openings exposing the conductive oxide layer. The metal reflection layer is disposed on the dielectric layer, and connected to the conductive oxide layer through the openings of the dielectric layer. The lower insulation layer covers the mesa and the metal reflection layer, and includes at least one first opening exposing the first conductivity type semiconductor layer and a second opening exposing the metal reflection layer.

The light emitting diode further includes a first pad metal layer, a second pad metal layer, and an upper insulation layer. The first pad metal layer is disposed on the lower insulation layer, and electrically connected to the first conductivity type semiconductor layer through the at least one first opening. The second pad metal layer is disposed on the lower insulation layer, and electrically connected to the metal reflection layer through the second opening. The upper insulation layer covers the first pad metal layer and the second pad metal layer, and including a first opening exposing the first pad metal layer and a second opening exposing the second pad metal layer. The openings of the dielectric layer include openings that have different sizes from one another, and at least one of the openings in the dielectric layer adjacent to the first opening of the upper insulation layer has a width or a length greater than at least one another opening of the dielectric layer that is disposed farther from the first opening of the upper insulation layer.

A light emitting diode according to further another exemplary embodiment includes: a first conductivity type semiconductor layer; a mesa disposed on the first conductivity type semiconductor layer, and including an active layer and a second conductivity type semiconductor layer; a transparent conductive oxide layer disposed on the mesa and electrically connected to the second conductivity type semiconductor layer. The light emitting diode further include a dielectric layer, a metal reflection layer, a lower insulation layer, a first pad metal layer, a second pad metal layer, an upper insulation layer. The dielectric layer covers the conductive oxide layer, and including a plurality of openings exposing the conductive oxide layer. The metal reflection layer is disposed on the dielectric layer, and connecting to the conductive oxide layer through the openings of the dielectric layer. The lower insulation layer covers the mesa and the metal reflection layer, and including at least one first opening exposing the first conductivity type semiconductor layer and a second opening exposing the metal reflection layer. The first pad metal layer is disposed on the lower insulation layer, and electrically connected to the first conductivity type semiconductor layer through the at least one first opening. The second pad metal layer is disposed on the lower insulation layer, and electrically connected to the metal reflection layer through the second opening. The upper insulation layer covers the first pad metal layer and the second pad metal layer, and including a first opening exposing the first pad metal layer and a second opening exposing the second pad metal layer. The openings of the dielectric layer include openings disposed under the first opening of the upper insulation layer, and, among the openings disposed under the first opening of the upper insulation layer and adjacent to the first opening of the lower insulation layer, a distance of an opening spaced apart from the first opening in the vertical direction is greater than a distance of an opening of the dielectric layer closest to the first opening.

According to exemplary embodiments of the present disclosure, a reflection structure of a conductive oxide layer, a dielectric layer, and a metal reflection layer is used instead of a conventional ohmic reflection layer. As such, it is possible to prevent a bonding material such as solder from diffusing into a contact region, and to provide a stable ohmic contact resistance, thereby improving the reliability of a light emitting diode. Moreover, high light output and low forward voltage may be achieved by adjusting a thickness of the dielectric layer.

According to exemplary embodiments of the present disclosure, it is possible to provide a light emitting diode that is resistant to electrical overstress or electrostatic discharge by controlling a location, a size, or a shape of openings formed in the dielectric layer.

Other advantages and effects of the present disclosure will become more apparent from the detailed description.

DETAILED DESCRIPTION

Figure 1:
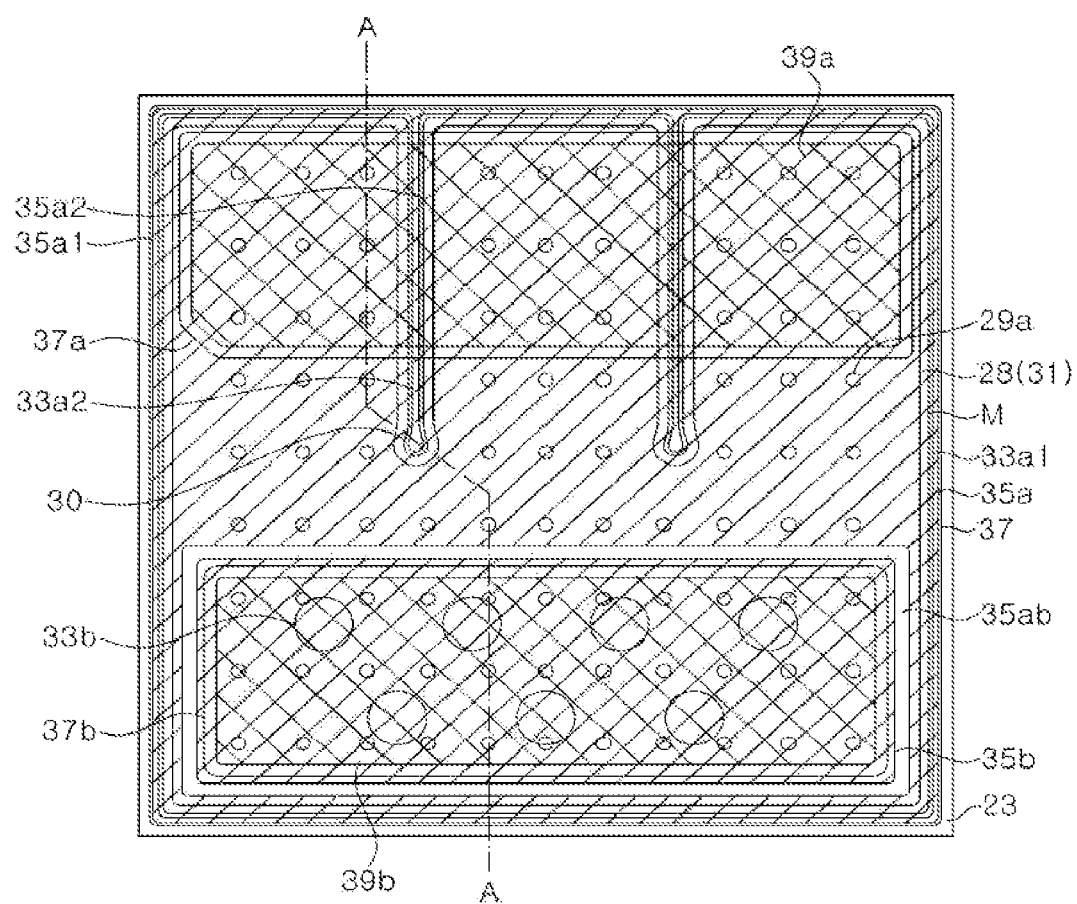
FIG. 1 is a schematic plan view illustrating a light emitting diode according to an exemplary embodiment.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

A light emitting diode according to an exemplary embodiment includes: (i) a first conductivity type semiconductor layer; (ii) a mesa disposed on the first conductivity type semiconductor layer, and including an active layer and a second conductivity type semiconductor layer; (iii) a transparent conductive oxide layer disposed on the mesa and electrically connected to the second conductivity type semiconductor layer; (iv) a dielectric layer covering the conductive oxide layer, and including a plurality of openings exposing the conductive oxide layer, the dielectric layer having a lower refractive index than those of the second conductivity type semiconductor layer and the conductive oxide layer; (v) a metal reflection layer disposed on the dielectric layer, and connecting to the conductive oxide layer through the openings of the dielectric layer; (vi) a lower insulation layer covering the mesa and the metal reflection layer, and including a first opening exposing the first conductivity type semiconductor layer and a second opening exposing the metal reflection layer; (vii) a first pad metal layer disposed on the lower insulation layer, and electrically connected to the first conductivity type semiconductor layer through the first opening; (viii) a second pad metal layer disposed on the lower insulation layer, and electrically connected to the metal reflection layer through the second opening; and (ix) an upper insulation layer covering the first pad metal layer and the second pad metal layer, and including a first opening exposing the first pad metal layer and a second opening exposing the second pad metal layer, in which the dielectric layer has a thickness in a range of about 4 to about 13 times greater than that of the second conductivity type semiconductor layer.

In some embodiments, the dielectric layer may have a thickness in a range of about 200 nm to about 1000 nm, and specifically, may have a thickness in a range of about 300 nm to about 800 nm. High light output and low forward voltage may be achieved within the thickness range.

In some embodiments, the conductive oxide layer may have a thickness within a range of about 3 nm to about 50 nm, and specifically, may have a thickness in a range of about 6 nm to about 30 nm. Favorable ohmic contact resistance may be obtained within the thickness range, and light loss due to light absorption may be reduced.

The dielectric layer may cover side surfaces of the mesa, and partially cover the first conductivity type semiconductor layer around the mesa.

The lower insulation layer may cover an edge of the dielectric layer.

The first opening of the lower insulation layer may expose the first conductivity type semiconductor layer along a periphery of the mesa, and the first pad metal layer may have an outer contact portion that contacts the first conductivity type semiconductor layer along the periphery of the mesa. The first pad metal layer contacts the first conductivity type semiconductor layer along the periphery of the mesa, so that current spreading capability of the light emitting diode may be improved.

The mesa may include an indent portion that exposes the first conductivity type semiconductor layer, and the first opening of the lower insulation layer may further expose the first conductivity type semiconductor layer in the indent portion. Furthermore, the first pad metal layer may further include an inner contact portion that contacts the first conductivity type semiconductor layer in the indent portion. Since the first pad metal layer contacts the first conductivity type semiconductor layer at the periphery of the mesa and inside the mesa, current spreading capability of the light emitting diode may be further enhanced.

Furthermore, the inner contact portion may be connected to the outer contact portion, but the inventive concepts are not limited thereto, the inner contact portion and the outer contact portion may be separated from each other.

In some exemplary embodiments, the mesa may have a via hole exposing the first conductivity type semiconductor layer through the second conductivity type semiconductor layer and the active layer, in which the first opening of the lower insulation layer may expose the first conductivity type semiconductor layer exposed in the via hole, and the first pad metal layer may have an inner contact portion that contacts the first conductivity type semiconductor layer exposed in the via hole.

The first pad metal layer may include outer contact portions that contact the first conductivity type semiconductor layer at the outside of the mesa, in which the outer contact portions may be spaced apart from one another.

The light emitting diode may further include: a first bump pad connected to the first pad metal layer through the first opening of the upper insulation layer; and a second bump pad connected to the second pad metal layer through the second opening of the upper insulation layer. The first and second bump pads may be used as bonding pads when the light emitting diode is mounted on a circuit board or the like to manufacture a light emitting module.

The lower insulation layer may include a plurality of second openings, and the second bump pad may cover an upper portion of at least one second opening of the lower insulation layer.

A location and a shape of the first bump pad may be variously modified as long as the first bump pad is insulated from the second pad metal layer, and a location and a shape of the second bump pad may also be variously modified as long as the second bump pad is insulated from the first pad metal layer.

The second pad metal layer may be surrounded by the first pad metal layer. As such, a boundary region in which the lower insulation layer is exposed may be formed between the first pad metal layer and the second pad metal layer. The boundary region may be covered by the upper insulation layer.

In some exemplary embodiments, the second bump pad may be disposed within an upper region of the second pad metal layer, but the inventive concepts are not limited thereto, the second bump pad may partially overlap with the first pad metal layer.

The light emitting diode may further include a substrate disposed on a side of the first conductivity type semiconductor layer. The substrate is configured to transmit light generated in the active layer.

A light emitting diode according to another exemplary embodiment includes: (i) a first conductivity type semiconductor layer; (ii) a mesa disposed on the first conductivity type semiconductor layer, and including an active layer and a second conductivity type semiconductor layer; (iii) a transparent conductive oxide layer disposed on the mesa and electrically connected to the second conductivity type semiconductor layer; (iv) a dielectric layer covering the conductive oxide layer, and including a plurality of openings exposing the conductive oxide layer, the dielectric layer having a lower refractive index than those of the second conductivity type semiconductor layer and the conductive oxide layer; (v) a metal reflection layer disposed on the dielectric layer, and connecting to the conductive oxide layer through the openings of the dielectric layer, in which the dielectric layer has a lower refractive index than those of the conductive oxide layer and the second conductivity type semiconductor layer, and has a thickness in a range of about 300 nm to about 800 nm.

A thickness of the dielectric layer may be in a range of 4 times or greater than to 13 times or less than a thickness of the second conductivity type semiconductor layer.

The conductive oxide layer may be an indium tin oxide (ITO) layer, and the ITO layer may have a thickness in a range of about 6 nm to about 30 nm.

In some embodiments, the light emitting diode may further include: a substrate disposed on a side of the first conductivity type semiconductor layer; a first bump pad disposed over the metal reflection layer, and electrically connected to the first conductivity type semiconductor layer; and a second bump pad disposed over the metal reflection layer, and electrically connected to the metal reflection layer.

A light emitting diode according to another exemplary embodiment includes: (i) a first conductivity type semiconductor layer; (ii) a mesa disposed on the first conductivity type semiconductor layer, and including an active layer and a second conductivity type semiconductor layer; (iii) a transparent conductive oxide layer disposed on the mesa and electrically connected to the second conductivity type semiconductor layer; (iv) a dielectric layer covering the conductive oxide layer, and including a plurality of openings exposing the conductive oxide layer; (v) a metal reflection layer disposed on the dielectric layer, and connecting to the conductive oxide layer through the openings of the dielectric layer; (vi) a lower insulation layer covering the mesa and the metal reflection layer, and including at least one first opening exposing the first conductivity type semiconductor layer and a second opening exposing the metal reflection layer; (vii) a first pad metal layer disposed on the lower insulation layer, and electrically connected to the first conductivity type semiconductor layer through the at least one first opening; (viii) a second pad metal layer disposed on the lower insulation layer, and electrically connected to the metal reflection layer through the second opening; and (ix) an upper insulation layer covering the first pad metal layer and the second pad metal layer, and including a first opening exposing the first pad metal layer and a second opening exposing the second pad metal layer, in which the openings of the dielectric layer include a narrow and elongated bar-shaped opening adjacent to at least one of the first openings of the lower insulation layer.

The bar-shaped opening is arranged to be adjacent to the first opening of the lower insulation layer, and thus, it is possible to prevent the light emitting diode from being damaged by electrical overstress or electrostatic discharge.

The dielectric layer may include openings having other shapes in addition to the bar-shaped opening, and the bar-shaped opening may be disposed between the first opening of the lower insulation layer corresponding to the bar-shaped opening and the openings having other shapes.

The first opening of the lower insulation layer corresponding to the bar-shaped opening may have an elongated shape in one direction, and the bar-shaped opening of the dielectric layer may be disposed to be flush with the first opening of the lower insulation layer corresponding to the bar-shaped opening.

The bar-shaped opening of the dielectric layer may be longer than the first opening of the lower insulation layer corresponding to the bar-shaped opening. As such, it is possible to provide a light emitting diode that is more resistant to electrical overstress and electrostatic discharge than a conventional light emitting diode.

The lower insulation layer may have a plurality of first openings exposing the first conductivity type semiconductor layer around the mesa, and the first pad metal layer may have outer contact portions in contact with the first conductivity type semiconductor layer in the plurality of first openings.

The dielectric layer may have a plurality of bar-shaped openings adjacent to the plurality of first openings, respectively.

The bar-shaped opening of the dielectric layer may be arranged lengthily over the outer contact portions.

The light emitting diode may further include a first bump pad; and a second bump pad, in which the first bump pad and the second bump pad may be electrically connected to the first pad metal layer and the second pad metal layer through the first opening and the second opening of the upper insulation layer, respectively, and at least a portion of the bar-shaped opening may be disposed under the first bump pad.

A portion of the bar-shaped opening may be disposed under the second bump pad.

The light emitting diode may further include a substrate disposed on a side of the first conductivity type semiconductor layer, in which the substrate is configured to transmit light generated in the active layer.

The first pad metal layer may have protrusions along one edge of the mesa M, in which the first pad metal layer may have outer contact portions in contact with the first conductivity type semiconductor layer near an edge of the mesa, the outer contact portions may be formed by the protrusions, and a region between the protrusions of edges of the first pad metal layer may be disposed on the conductive oxide layer.

A light emitting diode according to another exemplary embodiment includes: (i) a first conductivity type semiconductor layer; (ii) a mesa disposed on the first conductivity type semiconductor layer, and including an active layer and a second conductivity type semiconductor layer; (iii) a transparent conductive oxide layer disposed on the mesa and electrically connected to the second conductivity type semiconductor layer; (iv) a dielectric layer covering the conductive oxide layer, and including a plurality of openings exposing the conductive oxide layer; (v) a metal reflection layer disposed on the dielectric layer, and connecting to the conductive oxide layer through the openings of the dielectric layer; (vi) a lower insulation layer covering the mesa and the metal reflection layer, and including at least one first opening exposing the first conductivity type semiconductor layer and a second opening exposing the metal reflection layer; (vii) a first pad metal layer disposed on the lower insulation layer, and electrically connected to the first conductivity type semiconductor layer through the at least one first opening; (viii) a second pad metal layer disposed on the lower insulation layer, and electrically connected to the metal reflection layer through the second opening; and (ix) an upper insulation layer covering the first pad metal layer and the second pad metal layer, and including a first opening exposing the first pad metal layer and a second opening exposing the second pad metal layer, in which the openings of the dielectric layer include openings that have different sizes from one another, and at least one of the openings in the dielectric layer adjacent to the first opening of the upper insulation layer has a width or a length greater than at least one another opening of the dielectric layer that is disposed farther from the first opening of the upper insulation layer.

Since the opening of the dielectric layer adjacent to the region where the first opening of the upper insulation layer, that is, the first pad metal layer contacts the first conductive semiconductor layer is set to be larger than the remaining openings of the dielectric layer, a light emitting diode having strong resistance to electrical overstress or electrostatic discharge may be provided.

In some exemplary embodiments, the opening of the dielectric layer having a greater width or length may have a bar shape. In other exemplary embodiments, the opening of the dielectric layer may have a circular or ring shape.

The light emitting diode may further include: a first bump pad; and a second bump pad, in which the first bump pad and the second bump pad may be electrically connected to the first pad metal layer and the second pad metal layer through the first opening and the second opening of the upper insulation layer, respectively, and at least a portion of the opening of the dielectric layer having a greater width or length may be disposed under the first bump pad.

At least one of the openings of the dielectric layer having a greater width or length may extend from a bottom of the first bump pad to a bottom of the second bump pad.

The mesa may have a via hole that exposes the first conductivity type semiconductor layer, in which the first openings of the lower insulation layer may include an opening that exposes the first conductivity type semiconductor layer in the via hole, the first pad metal layer may include an inner contact portion that contacts the first conductivity type semiconductor layer in the via hole, and the opening of the dielectric layer having a greater width or length may be disposed adjacent to the via hole.

The opening of the dielectric layer disposed adjacent to the via hole may surround the via hole.

The first pad metal layer may include outer contact portions that contact the first conductivity type semiconductor layer at the outside of the mesa, in which the outer contact portions may be spaced apart from one another, and the openings of the dielectric layer having a greater width or length may be disposed adjacent to the outer contact portions, respectively.

The dielectric layer may have a lower refractive index than those of the second conductivity type semiconductor layer and the conductive oxide layer, and may have a thickness in a range of about 300 nm to about 800 nm. The conductive oxide layer may also have a thickness in a range of about 3 nm to about 50 nm.

The light emitting diode may further include a substrate disposed on a side of the first conductivity type semiconductor layer, in which the substrate may be configured to transmit light generated in the active layer.

A light emitting diode according to another exemplary embodiment includes: (i) a first conductivity type semiconductor layer; (ii) a mesa disposed on the first conductivity type semiconductor layer, and including an active layer and a second conductivity type semiconductor layer; (iii) a transparent conductive oxide layer disposed on the mesa and electrically connected to the second conductivity type semiconductor layer; (iv) a dielectric layer covering the conductive oxide layer, and including a plurality of openings exposing the conductive oxide layer; (v) a metal reflection layer disposed on the dielectric layer, and connecting to the conductive oxide layer through the openings of the dielectric layer; (vi) a lower insulation layer covering the mesa and the metal reflection layer, and including at least one first opening exposing the first conductivity type semiconductor layer and a second opening exposing the metal reflection layer; (vii) a first pad metal layer disposed on the lower insulation layer, and electrically connected to the first conductivity type semiconductor layer through the at least one first opening; (viii) a second pad metal layer disposed on the lower insulation layer, and electrically connected to the metal reflection layer through the second opening; and (ix) an upper insulation layer covering the first pad metal layer and the second pad metal layer, and including a first opening exposing the first pad metal layer and a second opening exposing the second pad metal layer, in which the openings of the dielectric layer include openings disposed under the first opening of the upper insulation layer, and, among the openings disposed under the first opening of the upper insulation layer and adjacent to the first opening of the lower insulation layer, a distance of an opening spaced apart from the first opening in the vertical direction is greater than a distance of an opening of the dielectric layer closest to the first opening.

The light emitting diode having improved resistance to electrical overstress or electrostatic discharge may be provided by adjusting the distance between the contact portion where the first pad metal layer contacts the first conductivity type semiconductor layer and the openings of the dielectric layer adjacent thereto.

Hereinafter, exemplary embodiments of the inventive concepts will be described in detail with reference to the accompanying drawings.

Figure 2:
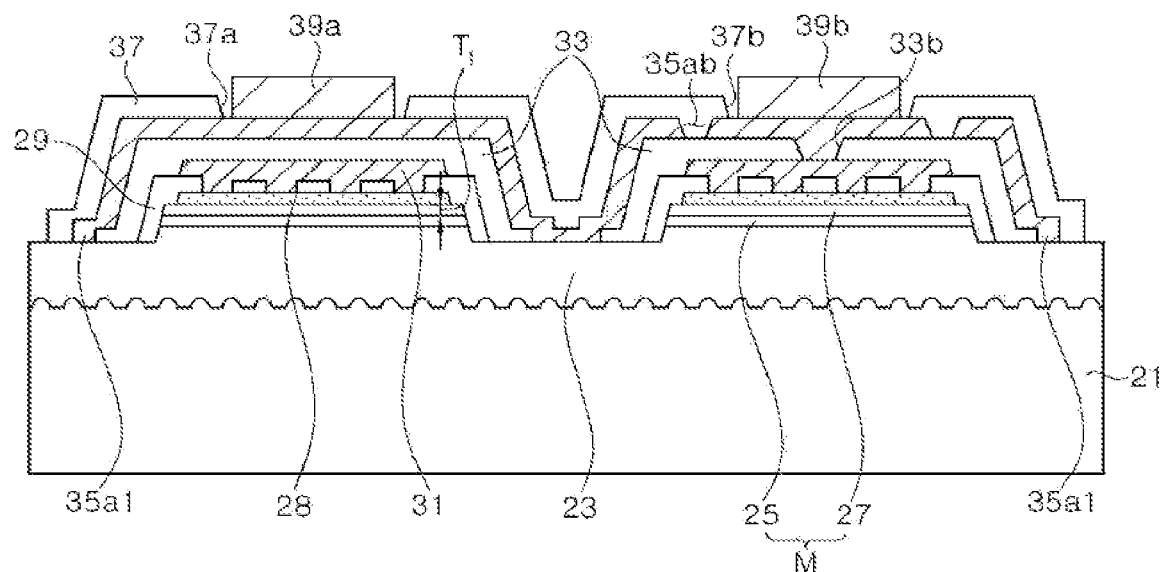
FIG. 2 is a cross-sectional view taken along the line A-A in FIG. 1.

FIG. 1 is a schematic plan view illustrating a light emitting diode according to an exemplary embodiment, and FIG. 2 is a cross-sectional view taken along the line A-A in FIG. 1.

Referring to FIG. 1 and FIG. 2, the light emitting diode includes a substrate 21, a first conductivity type semiconductor layer 23, an active layer 25, a second conductivity type semiconductor layer 27, a conductive oxide layer 28, a dielectric layer 29, a metal reflection layer 31, a lower insulation layer 33, a first pad metal layer 35*a*, a second pad metal layer 35*b*, and an upper insulation layer 37. The light emitting diode may further include a first bump pad 39*a* and a second bump pad 39*b*.

The substrate 21 may be selected from any substrates that are suitable for growth of gallium nitride semiconductor layers thereon. The substrate 21 may include, for example, a sapphire substrate, a gallium nitride substrate, a SiC substrate, and the like, and may be a patterned sapphire substrate. The substrate 21 may have a rectangular or square shape, as shown in the plan view of FIG. 1, without being limited thereto. A size of the substrate 21 is not particularly limited and may be selected in various ways.

The first conductivity type semiconductor layer 23 is disposed on the substrate 21. The first conductivity type semiconductor layer 23 may be a gallium nitride semiconductor layer grown on the substrate 21 and doped with dopants, for example Si.

An edge of the first conductivity type semiconductor layer 23 according to the exemplary embodiment is flush with an edge of the substrate 21, as shown in FIG. 2. However, the inventive concepts are not limited thereto, and the first conductivity type semiconductor layer 23 may be located inside a region surrounded by the edge of the substrate 21. In this case, a portion of the upper surface of the substrate 21 may be exposed along a periphery of the first conductivity type semiconductor layer 23.

A mesa M is disposed on the first conductivity type semiconductor layer 23. The mesa M may be disposed within a region surrounded by the first conductivity type semiconductor layer 23 so that regions near edges of the first conductivity type semiconductor layer 23 are not covered by the mesa M, but exposed to the outside.

The mesa M includes the second conductivity type semiconductor layer 27 and the active layer 25. The active layer 25 is interposed between the first conductivity type semiconductor layer 23 and the second conductivity type semiconductor layer 27. The active layer 25 may have a single quantum well structure or a multiple quantum well structure.

A location and a thickness of the well layer in the active layer 25 determine a wavelength of light that is generated. In particular, by controlling the location of the well layer, it is possible to provide an active layer generating ultraviolet light, blue light or green light.

The second conductivity type semiconductor layer 27 may be a gallium nitride-based semiconductor layer doped with a p-type impurity, for example, Mg. A concentration of the p-type impurity of the second conductivity type semiconductor layer 27 affects a refractive index of the second conductivity type semiconductor layer 27. The concentration of the p-type impurity of the second conductivity type semiconductor layer 27 may be in a range of about $8\times10^{18}$ to about $4\times10^{-21}/cm^3$. When the concentration of the impurity is lower than $8\times10^{-18}/cm^3$, effect that increases the refractive index is not obtained. When the concentration of the impurity is higher than $4\times10^{-21}/cm^3$, it is difficult to form a stable ohmic contact.

The concentration of the p-type impurity of the second conductivity type semiconductor layer 27 may not have a constant value, but it may have a concentration profile that varies with thickness within the above range. In particular, it may have a higher impurity concentration on a side thereof closer to the conductive oxide layer 28 to have a higher refractive index on a surface of the second conductivity type semiconductor layer 27.

As such, a difference between the refractive index of the second conductivity type semiconductor layer 27 and that of the conductive oxide layer 28 may be increased by increasing the refractive index of the second conductivity type semiconductor layer 27. The difference in refractive indexes between the second conductivity type semiconductor layers 28 and the conductive oxide layer 28 is set to be substantially similar to the difference in refractive indexes between the conductive oxide layer 28 and the dielectric layer 29, and thus, light extraction may be effective.

Figure 3:
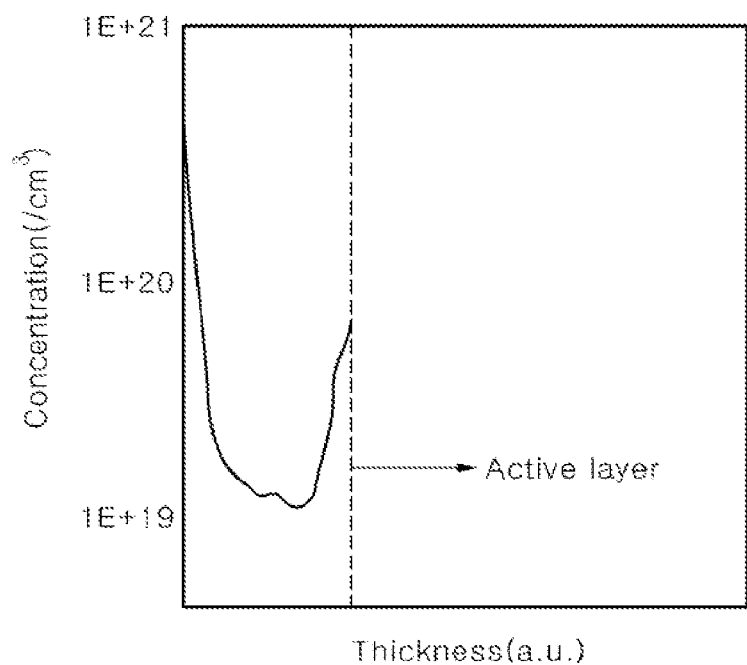
FIG. 3 is a graph schematically showing a doping profile of a p-type impurity in a second conductivity type semiconductor layer.

FIG. 3 illustrates a concentration profile in the second conductivity type semiconductor layer 27. As shown in FIG. 3, a concentration of a p-type impurity of the second conductivity type semiconductor layer 27, for example, a concentration of Mg may include a section that has different gradients of concentration from each other. The concentration thereof may have a profile that the concentration decreases as a measurement point is closer to the active layer 25, and increases as the measurement point is closer to the conductive oxide layer 28. In particular, the concentration sharply increases as the measurement point approaches the conductive oxide layer 28, and it may have a gradient greater than an absolute value of gradient's decrease in concentration near the active layer 25. As such, a portion where the refractive index is sharply increased is in contact with the conductive oxide layer 28, and thus, light extraction effect may be maximized.

Each of the first conductivity type semiconductor layer 23 and the second conductivity type semiconductor layer 27 may be composed of a single layer or multiple layers without limiting thereto, or may include super-lattice layers. The first conductivity type semiconductor layer 23, the active layer 25 and the second conductivity type semiconductor layer 27 may be grown on the substrate 21 in a chamber by a well-known method, such as metal organic chemical vapor delocation (MOCVD) or Molecular Beam Epitaxy (MBE).

As shown in FIG. 1, the mesa M may have an indent portion 30 penetrating therein, and an upper surface of the first conductivity type semiconductor layer 23 may be exposed by the indent portion 30. The indent portion 30 may be extend from one edge of the mesa M toward the other side opposite to the mesa M. A length of the indent portion 30 is not particularly limited, but may be ½ of the length of the mesa M or longer than that. Also, although two indent portions 30 are shown in FIG. 1, the number of indent portion 30 may be one or three or more. Accordingly, as the number of indent portions 30 increases, the number of inner contact portions 35a2 of the first pad metal layer 35a, which will be described later, increases, thereby improving current spreading capability.

The indent portion 30 has a round shape as a width becomes wider at an end terminal portion thereof. As the shape of the end terminal portion of the indent is formed as described above, the lower insulation layer 33 may be patterned in a similar shape. In particular, in a case that the lower insulation layer 33 includes a distributed Bragg reflector, if a width of the distributed Bragg reflector is not widened at the end terminal portion as shown in FIG. 1, a severe double step is formed in a side wall of the distributed Bragg reflector, and the pad metal layer 35a is likely to be cracked as an inclination angle of the side wall becomes large. Accordingly, an edge of the lower insulation layer 33 may be formed to have a gentle inclination angle by forming the shape of the end terminal portion of the indent portion 30 and the shape of the end terminal portion of the first opening 33a2 of the lower insulation layer 33 as those in the illustrated exemplary embodiment, thereby improving yield of the light emitting diode.

Although the indent portion 30 is illustrated and described as being formed in the mesa M in the exemplary embodiment, the mesa M may have at least one via hole passing through the second conductivity type semiconductor layer 27 and the active layer 25 instead of the indent portion 30.

The conductive oxide layer 28 is disposed over the mesa M to contact the second conductivity type semiconductor layer 27. The conductive oxide layer 28 may be disposed over almost an entire region of the mesa M. For example, the conductive oxide layer 28 may cover 80% or more, and further more than 90% or more of the upper region of the mesa M.

The conductive oxide layer 28 includes an oxide layer that transmits light generated in the active layer 25. The conductive oxide layer 28 may include for example, indium tin oxide (ITO) or ZnO. The conductive oxide layer 28 is formed to have a thickness sufficient for ohmic contacting with the second conductivity type semiconductor layer 27, and, for example, the conductive oxide layer 28 may be formed to have a thickness in a range of about 3 nm to about 50 nm, specifically, in a range of about 6 nm to about 30 nm. When the thickness of the conductive oxide layer 28 is too thin, it does not provide sufficient ohmic properties, thereby increasing the forward voltage. When the thickness of the conductive oxide layer 28 is too thick, light loss due to light absorption occurs, thereby lowering luminous efficiency.

The dielectric layer 29 may cover the conductive oxide layer 28, and may further cover side surfaces of the second conductivity type semiconductor layer 27, the active layer 25, and the first conductivity type semiconductor layer 23. An edge of the dielectric layer 29 may be covered with the lower insulation layer 33. Accordingly, the edge of the dielectric layer 29 is located farther from the edge of the substrate 21 than the edge of the lower insulation layer 33. However, the inventive concepts are not limited thereto, and a portion of the dielectric layer 29 may be exposed to the outside of the lower insulation layer 33.

The dielectric layer 29 has openings 29a exposing the conductive oxide layer 28. A plurality of openings 29a may be disposed over the conductive oxide layer 28. The openings 29a are used as connection passages so that the metal reflection layer 31 may be connected to the conductive oxide layer 28. The dielectric layer 29 also exposes the first conductivity type semiconductor layer 23 around the mesa M and exposes the first conductivity type semiconductor layer 23 in the indent portion 30.

The dielectric layer 29 includes an insulating material that has a lower refractive index than those of the second conductivity type semiconductor layer 27 and the conductive oxide layer 28. The dielectric layer 29 may include $SiO_2$, for example.

A thickness of the dielectric layer 29 affects the forward voltage and light output of the light emitting diode. The dielectric layer 29 may have a thickness in a range of about 200 nm to about 1000 nm, and specifically, may have a thickness in a range of about 300 nm to about 800 nm. When the thickness of the dielectric layer 29 is less than 200 nm, the forward voltage is high and the light output is low, which is not favorable. When the thickness of the dielectric layer 29 is more than 400 nm, the light output is saturated, and the forward voltage tends to increase again. Thus, it is advantageous that the thickness of the dielectric layer 29 does not exceed 1000 nm, and, in particular, the thickness thereof may be about 800 nm or less. The thickness of the dielectric layer 29 may be about 4 times or greater than a thickness of the second conductivity type semiconductor layer 27 on the active layer 25, and may be about 13 times or less than that of the second conductivity type semiconductor layer 27.

The metal reflection layer 31 is disposed on the dielectric layer 29 and is connected to the ohmic contact layer 28 through the openings 29a. The metal reflection layer 31 may include a reflective metal, and may include Ag or Ni/Ag, for example. The metal reflection layer 32 may further include a barrier layer to protect a reflective metal material layer, for example, Ni, and may also include an Au layer to prevent oxidation of the metal layer. A Ti layer may further be included under the Au layer to improve the adhesion of the Au layer. The metal reflection layer 31 is in contact with an upper surface of the dielectric layer 29, and thus, the thickness of the dielectric layer 29 is equal to a distance between the conductive oxide layer 28 and the metal reflection layer 31.

Since an ohmic contact is formed with the conductive oxide layer 28, and the metal reflection layer 31 is disposed on the dielectric layer 29, ohmic resistance may be prevented from being increased due to solder or the like. Furthermore, since the conductive oxide layer 28, the dielectric layer 29, and the metal reflection layer 31 are disposed on the second conductivity type semiconductor layer 27, reflectance of light may be improved, thereby improving luminous efficiency.

The lower insulation layer 33 covers the mesa M and the metal reflection layer 31. The lower insulation layer 33 may also cover the first conductivity type semiconductor layer 23 along a periphery of the mesa M, and may cover the first conductivity type semiconductor layer 23 in the indent portion 30 that is inside the mesa M. The lower insulation layer 33 covers side surfaces of the mesa M in particular. The lower insulation layer 33 may also cover the dielectric layer 29.

The lower insulation layer 33 has first and second openings 33a1 and 33a2 exposing the first conductivity type semiconductor layer 23 and a second opening 33b exposing the metal reflection layer 31. The first opening 33a1 exposes the first conductivity type semiconductor layer 23 along the periphery of the mesa M, and the first opening 33a2 exposes the first conductivity type semiconductor layer 23 in the indent portion 30. In a case that a via hole is formed instead of the indent portion 30, the first opening 33a2 exposes the first conductivity type semiconductor layer 23 in the via hole.

As shown in FIG. 1, the first openings 33a1 and 33a2 may be connected to each other. However, the inventive concepts are not limited thereto, and in other embodiments, the first opening 33a1 and the first opening 33a2 may be separated from each other.

The first opening 33a1 of the lower insulation layer 33 is formed to expose all of the peripheral region including the edge of the first conductivity type semiconductor layer 23 in the illustrated exemplary embodiment. However, the inventive concepts are not limited thereto, and the first opening 33a1 of the lower insulation layer 33 may be formed to have a band shape along the periphery of the mesa M. In this case, the edge of the first conductivity type semiconductor layer 23 may be covered with the lower insulation layer 33 or may be flush with the edge of the lower insulation layer 33.

The second opening 33b exposes the metal reflection layer 31. A plurality of second openings 33b may be formed, and the second openings 33b may be disposed near one edge of the substrate 21 so as to face the indent portion 30. Locations of the second openings 33b will be described later.

The lower insulation layer 33 may include a single layer of $SiO_2$ or $Si_3N_4$, without being limited thereto. For example, the lower insulation layer 33 may have a multilayer structure which includes a silicon nitride layer and a silicon oxide layer, and may include a distributed Bragg reflector in which silicon oxide layers and titanium oxide layers are alternately stacked one above another.

The first pad metal layer 35a is disposed on the lower insulation layer 33 and is insulated from the mesa M and the metal reflection layer 31 by the lower insulation layer 33. The first pad metal layer 35a contacts the first conductivity type semiconductor layer 23 through the first openings 33a1 and 33a2 of the lower insulation layer 33, as shown in FIG. 2. The first pad metal layer 35a may include an outer contact portion 35a1 that contacts the first conductivity type semiconductor layer 23 along the periphery of the mesa M and an inner contact portion 35a2 that contacts the first conductivity type semiconductor layer 23 in the indent portion 30 or the via hole. The outer contact portion 35a1 contacts the first conductivity type semiconductor layer 23 near the edge of the substrate 21 along the periphery of the mesa M, and the inner contact portion 35a2 contacts the first conductivity type semiconductor layer 23 in a region surrounded by the outer contact portion 35a1. The outer contact portion 35a1 and the inner contact portion 35a2 may be connected to each other, but the inventive concepts are not limited thereto, and they may be separated from each other. In addition, the outer contact portion 35a1 may continuously contact the first conductivity type semiconductor layer 23 along the periphery of the mesa M, but it is not limited thereto, and a plurality of outer contact portions 35a1 may be disposed to be spaced apart from one another.

The second pad metal layer 35b is disposed on the upper region of the mesa M on the lower insulation layer 33, and is electrically connected to the metal reflection layer 31 through the second opening 33b of the lower insulation layer 33. The second pad metal layer 35b may be surrounded by the first pad metal layer 35a, and a boundary region 35ab may be formed therebetween. The lower insulation layer 33 is exposed to the boundary region 35ab, and the boundary region 35ab is covered with the upper insulation layer 37, which will be described later.

The first pad metal layer 35a and the second pad metal layer 35b may be formed in the same process and may include substantially the same material. The first and second pad metal layers 35a and 35b may include an ohmic reflection layer such as an Al layer, and the ohmic reflection layer may be formed on an adhesive layer such as Ti, Cr, Ni, or the like. Furthermore, a protective layer of a single layer or a multiple layer structure such as Ni, Cr, Au, or the like may be formed on the ohmic reflection layer. The first and second pad metal layers 35a and 35b may have multilayer structures of Cr/Al/Ni/Ti/Ni/Ti/Au/Ti, for example.

The upper insulation layer 37 covers the first and second pad metal layers 35a and 35b. The upper insulation layer 37 may also cover the first conductivity type semiconductor layer 23 along the periphery of the mesa M. In the illustrated exemplary embodiment, the upper insulation layer 37 may expose the first conductivity type semiconductor layer 23 along the edge of the substrate 21. However, the inventive concepts are not limited thereto, and the upper insulation layer 37 may cover all of the first conductivity type semiconductor layers 23, and may be flush with the edge of the substrate 21.

The upper insulation layer 37 has a first opening 37a exposing the first pad metal layer 35a and a second opening 37b exposing the second pad metal layer 35b. The first opening 37a and the second opening 37b may be disposed in the upper region of the mesa M and may be arranged to face each other. In particular, the first opening 37a and the second opening 37b may be disposed close to both side edges of the mesa M.

The upper insulation layer 37 may include a single layer of $SiO_2$ or $Si_3N_4$, without being limited thereto. For example, the upper insulation layer 37 may have a multilayer structure which includes a silicon oxide layer and a silicon nitride layer, and may include a distributed Bragg reflector in which silicon oxide layers and titanium oxide layers are alternately stacked one above another.

The first bump pad 39a electrically contacts the first pad metal layer 35a exposed through the first opening 37a of the upper insulation layer 37, and the second bump pad 39b electrically contacts the second pad metal layer 35b exposed through the second opening 37b. As shown in FIG. 1, the first bump pad 39a may be disposed in the first opening 37a of the upper insulation layer 37, and the second bump pad 39b may be disposed in the second opening 37b of the upper insulation layer 37. However, the inventive concepts are not limited thereto, and the first bump pad 39a and the second bump pad 39b may cover all of the first opening 37a and the second opening 37b to seal them, respectively. In addition, the second bump pad 39b may cover an upper region of the second opening 33b of the lower insulation layer 33. The second bump pad 39b may cover all of the second openings 33b of the lower insulation layer 33, but the inventive concepts are not limited thereto, a portion of the openings 33b may be disposed at the outside of the second bump pad 39b.

The second bump pad 39b may further be disposed within an upper region of the second pad metal layer 35a as shown in FIG. 1, but the inventive concepts are not limited thereto, and a portion of the second bump pad 39b may overlap with the first pad metal layer 35a. However, the upper insulation layer 37 may be disposed between the first pad metal layer 35a and the second bump pad 39b to insulate them.

According to the exemplary embodiment, a reflective structure with the conductive oxide layer 28, the dielectric layer 29, and the metal reflection layer 31 is used instead of a conventional ohmic reflection layer. As such, it is possible to prevent a bonding material such as solder from diffusing into the contact region, and to obtain a stable ohmic contact resistance, thereby improving the reliability of the light emitting diode. Furthermore, since the thickness of the dielectric layer 29 is set to be about 300 nm or more, high light output and low forward voltage may be achieved.

Figure 4A:
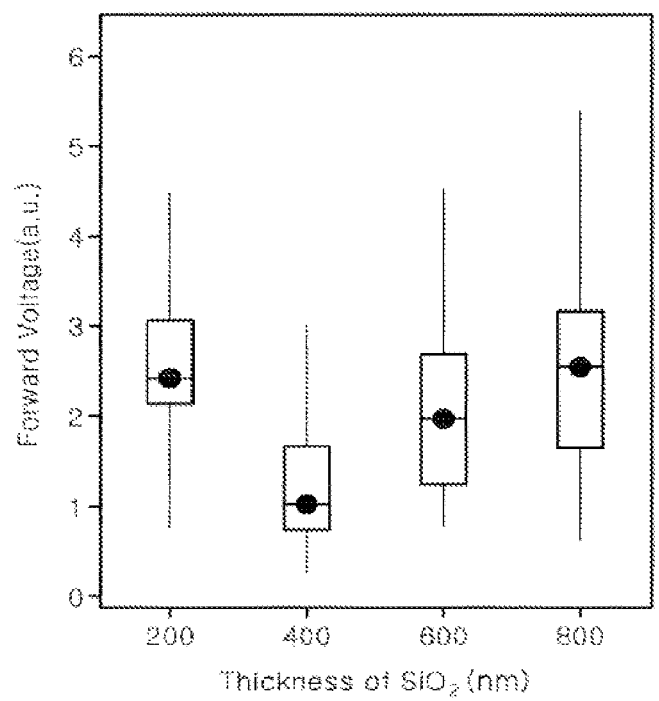
FIG. 4A and FIG. 4B are graphs showing forward voltage and light output according to thicknesses of a dielectric layer, respectively.
Figure 4B:
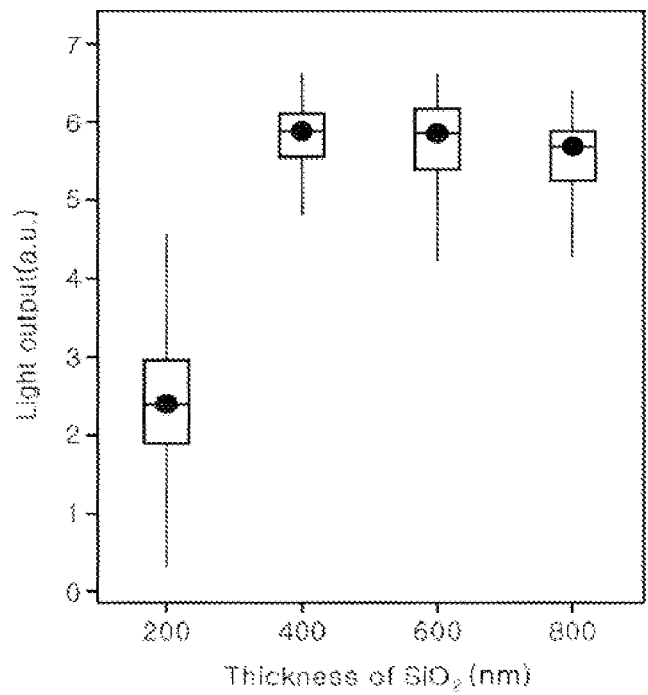

FIG. 4A and FIG. 4B are graphs showing forward voltage (Vf) and light output (Po) as a function of thicknesses of $SiO_2$ with a conductive oxide layer 28 as ITO and a dielectric layer 29 as $SiO_2$.

A thickness of ITO was 20 nm, and thicknesses of $SiO_2$ were changed to 200 nm, 400 nm, 600 nm, and 800 nm. A thickness of the second conductivity type semiconductor layer 27 was about 65 nm.

As shown in FIG. 4A, when the thickness of the dielectric layer 29 was 200 nm, the forward voltage was relatively high, and the lowest value exhibited when the thickness thereof was 400 nm. Also, as the thickness became greater than 400 nm, the forward voltage increased.

As shown in FIG. 4B, however, the lowest light output exhibited when the thickness of the dielectric layer 29 was 200 nm, and substantially similar light output exhibited when the thickness of the dielectric layer 29 was 400 nm or more.

Figure 5:
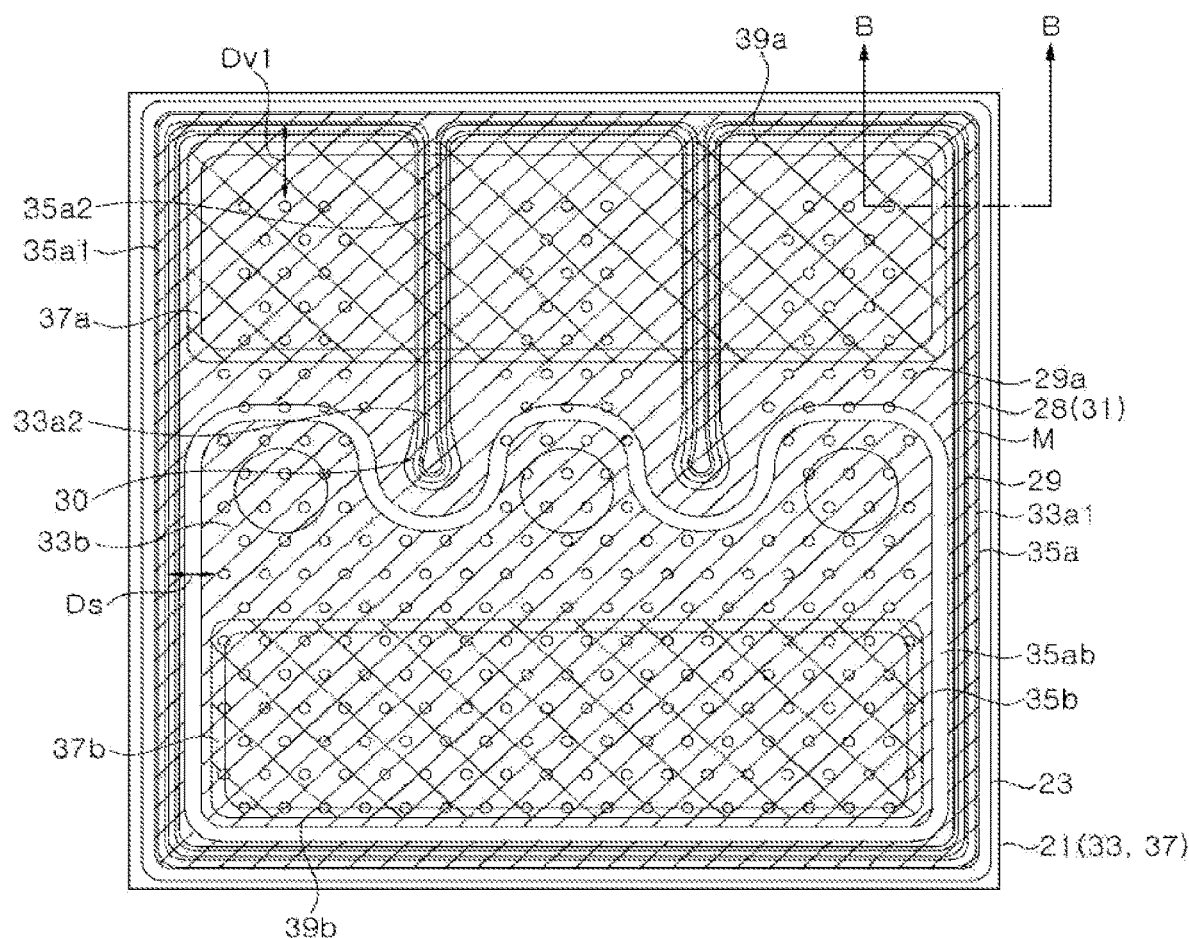
FIG. 5 is a schematic plan view illustrating a light emitting diode according to another exemplary embodiment.
Figure 6:
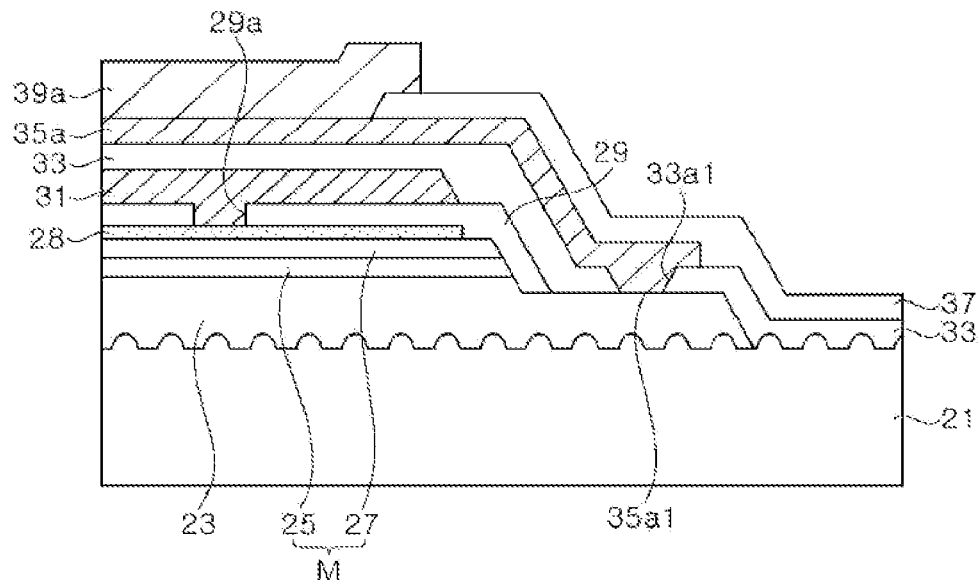
FIG. 6 is a cross-sectional view taken along the line B-B of FIG. 5.

FIG. 5 is a schematic plan view illustrating a light emitting diode according to another exemplary embodiment, and FIG. 6 is a cross-sectional view taken along the line B-B of FIG. 5.

Referring to FIG. 5 and FIG. 6, since the light emitting diode according to the exemplary embodiment is substantially similar to the light emitting diode described with reference to FIGS. 1 and 2, characteristic differences thereof will be mainly explained so as to avoid redundancy hereinafter.

First, in the previous exemplary embodiment, the edge of the first conductivity type semiconductor layer 23 is flush with the edge of the substrate 21. An edge of a first conductivity type semiconductor layer 23 in this embodiment, however, is disposed in a region surrounded by the edge of the substrate 21. As such, a region near the edge of the substrate 21 is exposed to the outside of the first conductivity type semiconductor layer 23.

In addition, locations of openings 29a of the dielectric layer 29 are adjusted in the exemplary embodiment, which will be described in detail later.

In the previous exemplary embodiment, the edge of the lower insulation layer 33 is located on the first conductivity type semiconductor layer 23, but, a lower insulation layer 33 in this exemplary embodiment covers the edge of the first conductivity type semiconductor layer 23, and is flush with the edge of the substrate 21, as shown in FIG. 6. A first opening 33a1 of the lower insulation layer 33 is limitedly disposed on the first conductivity type semiconductor layer 23, and is disposed in a ring shape along a periphery of mesa M.

Further, a second opening 33b of the lower insulation layer 33 is formed at the outside of a second bump pad 39b so as not to overlap with the second bump pad 39b. Since the second opening 33b are disposed to be spaced apart from the second bump pad 39b in the lateral direction, it is possible to prevent solder from diffusing into the light emitting diode while soldering the second bump pad 39b.

As shown in FIG. 6, a first pad metal layer 35a covers the first opening 33a1 of the lower insulation layer 33 to contact the first conductivity type semiconductor layer 23, and thus, an outer contact portion 35a1 is formed in the first opening 33a1. Referring back to FIG. 5, the outer contact portion 35a1 may be connected to an inner contact portion 35a2 or spaced apart from the inner contact portion 35a2, as described in the previous exemplary embodiment.

A shape of a second pad metal layer 35b in the exemplary embodiment is different from that of the second pad metal layer 35 in the exemplary embodiment of FIG. 1, and accordingly, a location of a boundary region between the second pad metal layer 35b and the first pad metal layer 35a is also different from that in the exemplary embodiment of FIG. 1. As shown in FIG. 5, the second pad metal layer 35b extends to a region between the inner contact portion 35a2 and the outer contact portion 35a1. In a case that a plurality of inner contact portions 35a2 are disposed, a front end of the second pad metal layer 35b may have a concave-convex shape as shown in the drawing. The first pad metal layer 35a may be spaced apart from the second pad metal layer 35b at regular intervals, and thus, the first pad metal layer 35a adjacent to the front end of the second pad metal layer 35b may also have a concave-convex shape.

Since the front end of the second pad metal layer 35b extends to near the inner contact portions 35a2, it is possible to easily separate the second openings 33b of the lower insulation layer 33 from the second bump pad 39b in the lateral direction.

An upper insulation layer 37 may cover the lower insulation layer 33, and an edge of the upper insulation layer 37 may be formed to be flush with the edges of the substrate 21 and the lower insulation layer 33. Although the first and second bump pads 39a and 39b are illustrated and described as being disposed within the first and second openings 37a and 37b of the upper insulation layer 37 in the previous exemplary embodiment, the first and second bump pads 39a and 39b cover and seal first and second openings 37a and 37b of the upper insulation layer 37 in the exemplary embodiment. That is, edges of the first and second bump pads 39a and 39b are located on an upper surface of the upper insulation layer 37. As such, the first pad metal layer 35a and the second pad metal layer 35b may be prevented from being exposed between the upper insulation layer 37 and the bump pads 39a and 39b, and thus, direct diffusion into the first and second pad metal layers 35a and 35b may be prevented.

Locations of the edges of the first conductivity type semiconductor layer 23, the lower insulation layer 33, the upper insulation layer 37, and the bump pads 39a and 39b in the exemplary embodiment, are different from those in the exemplary embodiment of FIG. 1, but the drawing herein is for illustrating an exemplary embodiment that can be modified with respect to the embodiment of FIG. 1 without being limited thereto. That is, the locations of the edges of the first conductivity type semiconductor layer 23, the lower insulation layer 33, and the upper insulation layer 37 in the exemplary embodiment may be the same as those of the embodiment of FIG. 1, and the exemplary embodiment in FIG. 1 may be modified as that in this exemplary embodiment.

The location of the openings 29a of a dielectric layer 29 in the exemplary embodiment are adjusted to enhance resistance to electrical overstress or electrostatic discharge. Although the reflective structure with the conductive oxide layer 28, the dielectric layer 29 and the metal reflection layer 31 improve the reflectance, the conductive oxide layer 28 and the metal reflection layer 31 need to be electrically connected. The openings 29a in the dielectric layer 29 provide a passage through which the metal reflection layer 31 electrically connects to the conductive oxide layer 28. In addition, a plurality of openings 29a are widely distributed on the conductive oxide layer 28 so as to evenly distribute current over a wide region of the conductive oxide layer 28. However, a distance between the outer contact portion 35a1 and the inner contact portion 35a2 and the openings 29a which are in contact with the first pad metal layer 35a may affect characteristics of the light emitting diode against electrical overstress or electrostatic discharge.

As a countermeasure against this, the illustrated exemplary embodiment as shown in FIG. 5 is characterized in that, among the openings 29a of the dielectric layer 29 disposed under the first opening 37a of the upper insulation layer 37 (or under the first bump pad 39a), the openings 29a located closest to the inner contact portion 35a2 are relatively spaced apart therefrom.

More particularly, a shortest distance Dv1 (FIG. 5) between the outer contact portion 35a1 and the opening 29a located under the first opening 37a of the upper insulation layer 37 is greater than a shortest distance Ds between the outer contact portion 35a1 and the openings 29a located outside the first openings 37a of the upper insulation layer 37. Although the distance between the outer contact portion 35a1 and the opening 29a is indicated in the drawing, the same description applies to a distance between the inner contact portion 35a2 and the opening 29a.

The distance between the opening 29a of the dielectric layer 29 located under the first bump pad 39a electrically connected to the first conductivity type semiconductor layer 23 and the contact portions 35a1 and 35a2 is greatly affected by electrical overstress and electrostatic discharge. Accordingly, the reliability of the light emitting diode may be improved by separating the openings 29a of the dielectric layer 29 located under the first bump pad 39a far away from the contact portions 35a1 and 35a2.

The openings 29a under the second bump pad 39b and those in other locations as well as the openings 29a under the first bump pad 39a may also be separated from the contact portions 35a1 and 35a2, but luminous efficiency may be lowered because current may not be widely distributed in this case. Therefore, the electrostatic discharge characteristics may be improved in the illustrated exemplary embodiment by arranging only the openings 29a located under the first bump pad 39a relatively far from other openings without deteriorating the current spreading performance.

Figure 7:
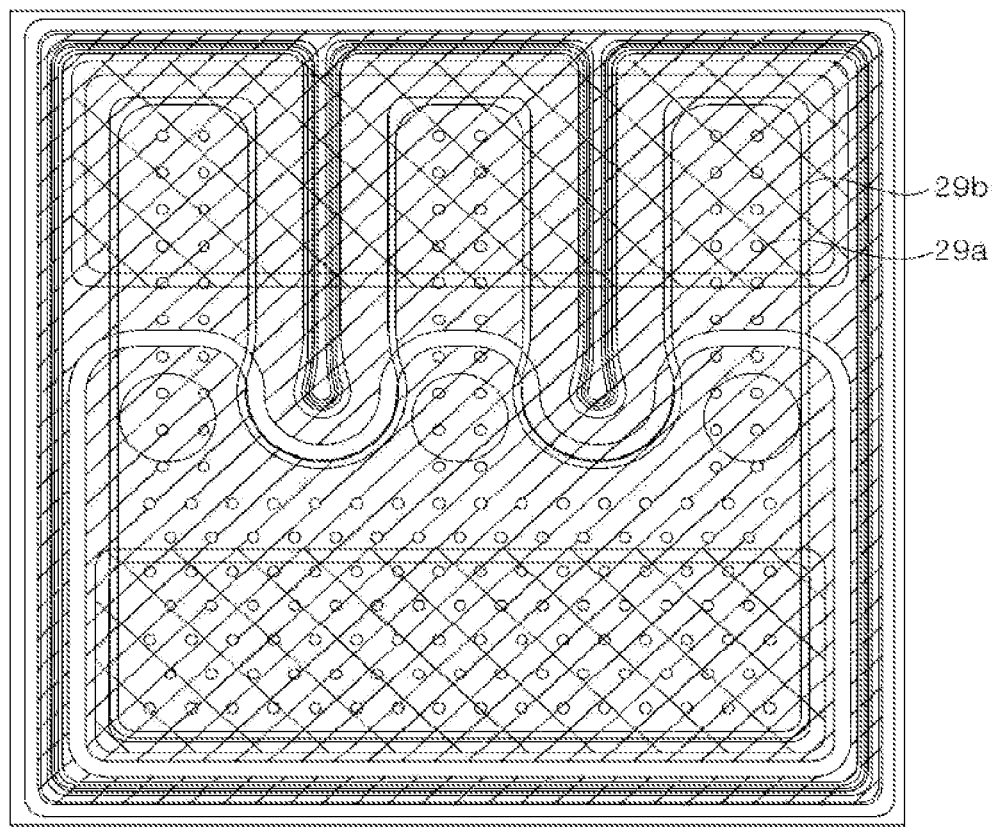
FIG. 7 is a schematic plan view illustrating a light emitting diode according to another exemplary embodiment.

FIG. 7 is a schematic plan view illustrating a light emitting diode according to another exemplary embodiment.

Referring to FIG. 7, the light emitting diode according to the exemplary embodiment is substantially similar to the light emitting diode described with reference to FIGS. 5 and 6, but openings of a dielectric layer 29 include elongated opening 29b along with a plurality of openings 29a in the exemplary embodiment.

When the opening 29b is located between an outer contact portion 35a1 and an inner contact portion 35a2 and the openings 29a, the opening 29b forms a closed loop along the outer contact portion 35a1 and the inner contact portion 35a2. Since the openings 29b adjacent to the outer contact portion 35a1 and the inner contact portion 35a2 are lengthily adjacent to the contact portions 35a1 and 35a2, it is possible to prevent a large difference in voltage from occurring at a specific point, and thus a light emitting diode having a strong resistance to electrical overstress or electrostatic discharge may be provided.

Although the opening 29b in the illustrated exemplary embodiment is shown and described as forming the closed loop, the openings 29b that has a shape having a length larger than a width may be arranged along the contact portions 35a1 and 35a2.

In the illustrated exemplary embodiment, it is described that the opening 29b is not limitedly disposed under a first bump pad 39a but also extends to the outside of the first bump pad 39a. In other embodiments, the opening 29b may be limitedly disposed under the first bump pad 39a.

Figure 8:
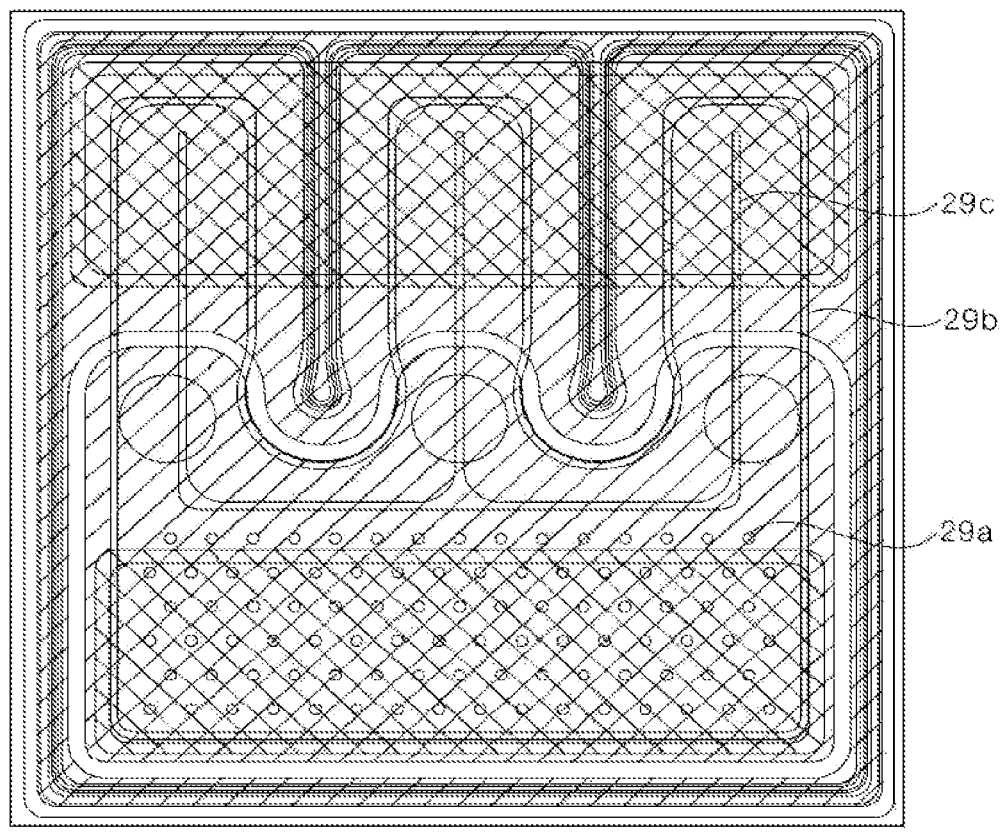
FIG. 8 is a schematic plan view illustrating a light emitting diode according to another exemplary embodiment.

FIG. 8 is a schematic plan view illustrating a light emitting diode according to another exemplary embodiment. Referring to FIG. 8, the light emitting diode according to the exemplary embodiment is substantially similar to the light emitting diode described with reference to FIG. 7, but openings of a dielectric layer 29 further include an opening 29c in the exemplary embodiment. The opening 29c may be disposed in a region surrounded by opening 29b, and in particular, may be located outside of a lower region of a second bump pad 39b. A portion of the opening 29c may also be located under the first bump pad 39b.

Figure 9:
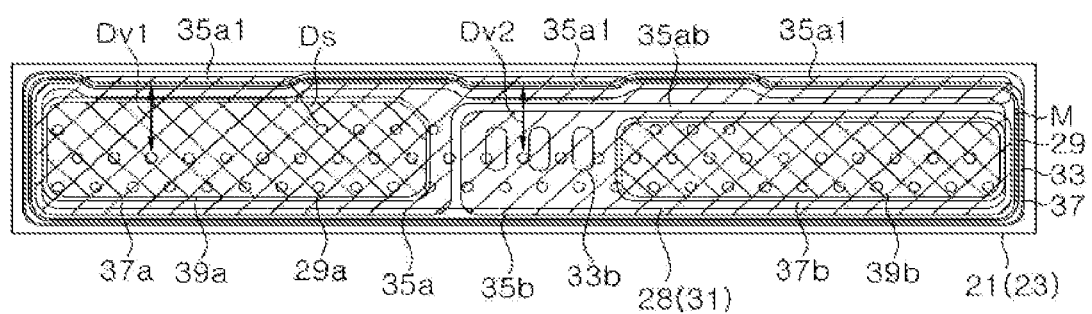
FIG. 9 is a schematic plan view illustrating a light emitting diode according to another exemplary embodiment.

FIG. 9 is a schematic plan view illustrating a light emitting diode according to another exemplary embodiment.

Referring to FIG. 9, the light emitting diode according to the exemplary embodiment is substantially similar to the light emitting diode described with reference to FIG. 5, but a mesa M has an elongated shape in one direction, outer contact portions 35a1 are formed near an edge of the mesa without inner contact portions 35a2, and a first pad metal layer 35a is formed not to surround a second pad metal layer 35b.

The mesa M has an elongated shape in one direction, and for example, a length thereof may be more than four times longer and less than seven times longer than a width thereof. When the mesa M is formed to have an elongated shape in one direction, a region where the first pad metal layer 35a contacts a first conductivity type semiconductor layer 23 may be relatively reduced, thereby securing the light emitting area.

In some embodiments, one edge of the mesa M may be formed to have recesses or protrusions.

A dielectric layer 29 covers a conductive oxide layer 28 and covers a side surface of the mesa M. A portion of the dielectric layer 29 partially covers the first conductivity type semiconductor layer 23 exposed around the mesa M as described with reference to FIG. 5. The dielectric layer 29 has a plurality of openings 29a exposing the conductive oxide layer 28, and locations of the openings 29a are adjusted to improve resistance to electrical overstress and electrostatic discharge. This will be described later.

A metal reflection layer 31 is disposed on the dielectric layer 29 and connects to the conductive oxide layer 28 through the openings 29a of the dielectric layer 29.

In the exemplary embodiment, the conductive oxide layer 28 and the metal reflection layer 31 cover most of an upper surface of the mesa M. However, edges of the conductive oxide layer 28 and the metal reflection layer 31 are spaced apart from the edge of the mesa M, and in particular, spaced farther from one edge of the mesa M that is adjacent to the outer contact portions 35a1. In particular, since the edge of the conductive oxide layer 28 is spaced farther from the outer contact portions 35, it is possible to prevent the occurrence of device failure due to electrical overstress or electrostatic discharge.

A lower insulation layer 33 may cover the dielectric layer 29 and the metal reflection layer 31, and may cover a portion of the first conductivity type semiconductor layer 23 exposed around the mesa M. The lower insulation layer 33 exposes the first conductivity type semiconductor layer 23 in recess regions of the mesa M. Although the lower insulation layer 33 may cover the first conductivity type semiconductor layer 23, it may be formed to expose a region near an edge of the first conductivity type semiconductor layer 23 as shown in FIG. 5. The lower insulation layer 33 also has a second opening 33b exposing the metal reflection layer 31.

The first pad metal layer 35a in the illustrated exemplary embodiment is disposed over the mesa M except for a region where the outer contact portions 35a1 are formed. However, in the exemplary embodiment of FIG. 5, the first pad metal layer 35a covers not only the upper region of the mesa M but also the side surface of the mesa M and a portion of the first conductivity type semiconductor layer 23 around the mesa M. An edge of the first pad metal layer 35a may also be located on the mesa M in a region between the recesses of the mesa M.

The first pad metal layer 35a may include a region that has a wide width toward one side of the mesa and a region that has a narrow width extending from thereof. The outer contact portions 35a1 are formed along one edge of the mesa M, and may be formed in the recesses formed at one edge of the mesa M. The outer contact portions 35a1 may be formed to have an elongated shape along the longitudinal direction of the mesa M. As illustrated in the drawing, the outer contact portions 35a1 may also be formed by the region having the wide width and the region having the narrow width of the first pad metal layer 35a.

The first pad metal layer 35a may have protrusions along one edge of the mesa M, and the protrusions may form the outer contact portions 35a1. A region between the protrusions among the edges of the first pad metal layer 35a may be located on the mesa M, and may further be located on the conductive oxide layer 28.

The second pad metal layer 35b may be disposed in the upper region of the mesa M. The second pad metal layer 35b may extend along the region having the narrow width of the first pad metal layer 35a. The second pad metal layer 35b may be electrically connected to the metal reflection layer 31 through the second openings 33b of the lower insulation layer 33. The second openings 33b of the lower insulation layer 33 may be disposed under the second bump pad 39b, but they may be spaced apart from the second bump pad 39b in the lateral direction as illustrated in FIG. 9.

In the exemplary embodiment, the openings 29a of the dielectric layer 29 are disposed apart from the edges of the mesas M, and in particular, disposed farther apart from the edge of the mesas M adjacent to the outer contact portions 35a1. In particular, among the openings 29a located under a first bump pad 39a, a distance Dv1 of a first set of the opening 29a that is disposed closest to the outer contact portion 35a1 in the vertical direction is greater than a distance Ds of a second set of the opening 29a that is disposed closest to the contact portion 35a1, as illustrated in FIG. 9. Further, the second set of the opening 29a that is disposed closest to the contact portion 35a1 is disposed farther from the edge of the mesa M than the opening closest to the edge of the mesa M.

Locations of the openings 29a disposed under the second bump pad 39b as well as those of the openings 29a disposed under the first bump pad 39a may be adjusted, and locations of a third set of the openings 29a disposed under the first bump pad 39a and the second bump pad 39b may also be adjusted. More particularly, as shown in FIG. 9, a separation distance Dv2 of the third set of the opening 29a that is disposed apart from the outer contact portion 35a1 in the vertical direction may be greater than the separation distance Ds of the second set of the opening 29a that is disposed closest to the contact portion 35a1. The openings 29a disposed under the second bump pad 39b may also be disposed in the same manner as illustrated in the drawing.

Figure 10:
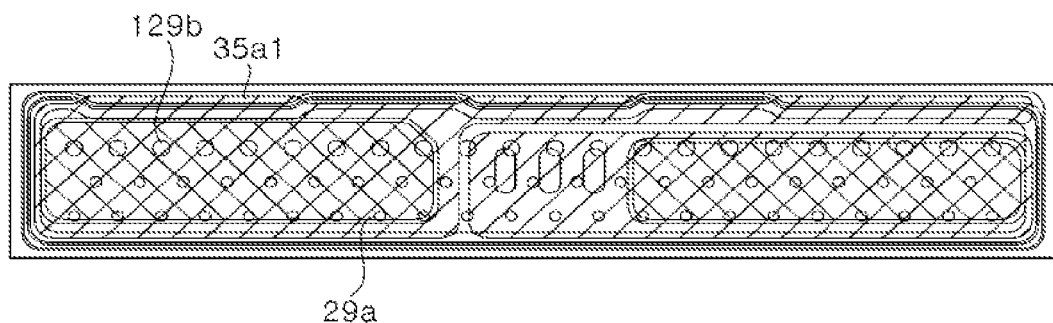
FIG. 10 is a schematic plan view illustrating a light emitting diode according to another exemplary embodiment.

FIG. 10 is a schematic plan view illustrating a light emitting diode according to another exemplary embodiment. Referring to FIG. 10, the light emitting diode according to the exemplary embodiment is substantially similar to the light emitting diode described with reference to FIG. 9, but a dielectric layer 29 has openings 29a and 129a that have different sizes from each other in the exemplary embodiment, as shown in FIG. 10.

In the illustrated exemplary embodiment, relatively large openings 129a are disposed closer to outer contact portions 35a1 than relatively small openings 29a. In particular, the relatively large openings 129a in a lower region of a first bump pad 39a are disposed closer to the outer contact portion 35a1 than the relatively small openings 29a. The relatively large openings 129a may also be disposed closer to the outer contact portions 35a1 than the relatively small openings 29a in a lower region of the second bump pad 39b and other regions.

The relatively large openings 129a may prevent current from being concentrated at a specific point, thereby improving resistance of the light emitting diode to electrical overstress or electrostatic discharge. The openings 129a in the illustrated exemplary embodiment are shown as being circular, but their shapes may vary. In particular, the openings 129a may have an elongated shape along the longitudinal direction of the mesa M, and for example, may have an ellipse shape or a bar shape.

Figure 11:
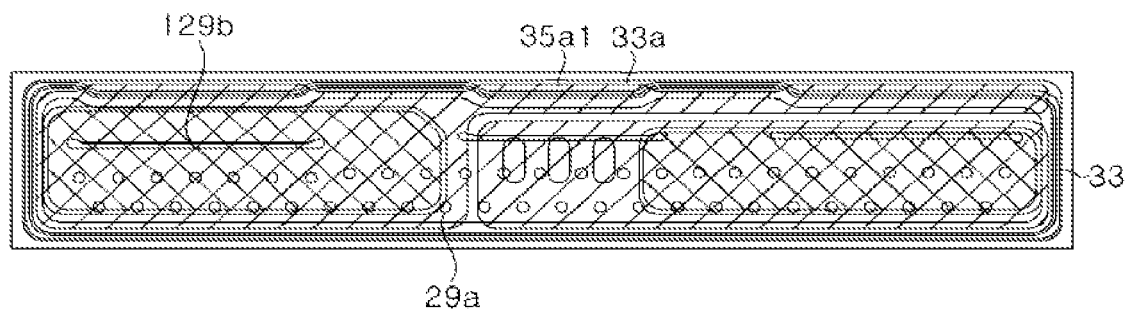
FIG. 11 is a schematic plan view illustrating a light emitting diode according to another exemplary embodiment.

FIG. 11 is a schematic plan view illustrating a light emitting diode according to another exemplary embodiment.

Referring to FIG. 11, the light emitting diode according to the exemplary embodiment is substantially similar to the light emitting diode described with reference to FIG. 10, but bar-shaped openings 129b are adjacent to outer contact portions 35a1 in the exemplary embodiment.

The bar-shaped opening 129b may be disposed under a first bump pad 39a, and bar-shaped openings 129b may further be disposed under a second bump pad 39b and in other regions. The bar-shaped openings 129b may be disposed flush with a first opening 33a of a lower insulation layer 33 or the outer contact portions 35a1.

The opening 129b is disposed between the outer contact portion 35a1 and openings 29a to prevent current from being concentrated at a specific point, thereby improving the light emitting diode's resistance to electrical overstress or electrostatic discharge. End portions of the bar-shaped openings 129b may be formed to have a relatively wide width to facilitate patterning.

Figure 12:
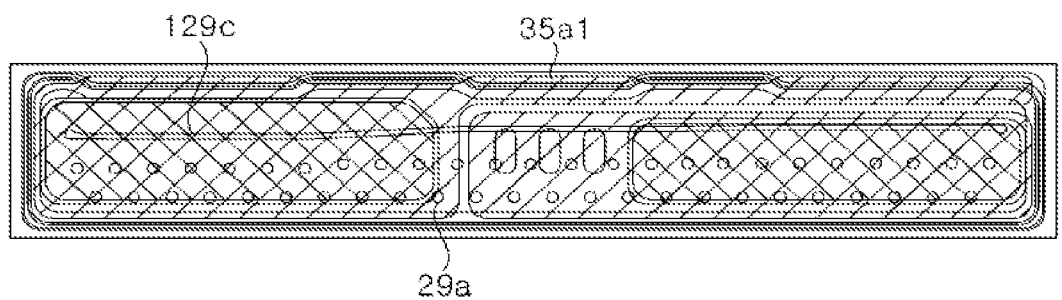
FIG. 12 is a schematic plan view illustrating a light emitting diode according to another exemplary embodiment.

FIG. 12 is a schematic plan view illustrating a light emitting diode according to another exemplary embodiment.

Referring to FIG. 12, the light emitting diode according to the exemplary embodiment is substantially similar to the light emitting diode described with reference to FIG. 11, but a single bar-shaped opening 129c is formed continuously over outer contact portions 35a1. The bar-shaped opening 129c is not necessarily a straight line. In particular, a portion of the opening 129c disposed under a first bump pad 39a may be disposed farther from the outer contact portion 35a1 than other portions.

Figure 13:
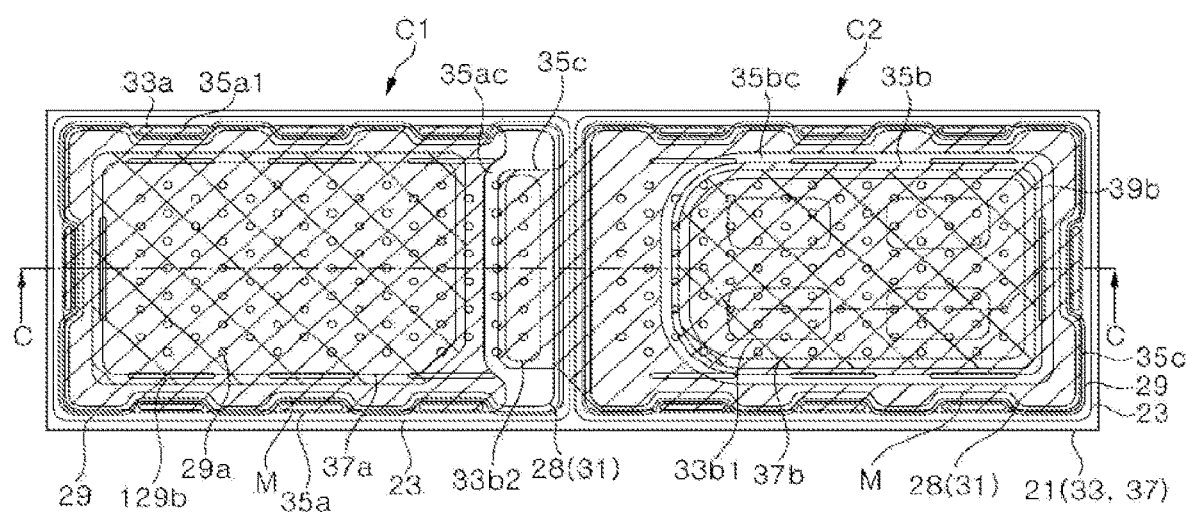
FIG. 13 is a schematic plan view illustrating a light emitting diode according to another exemplary embodiment.
Figure 14:
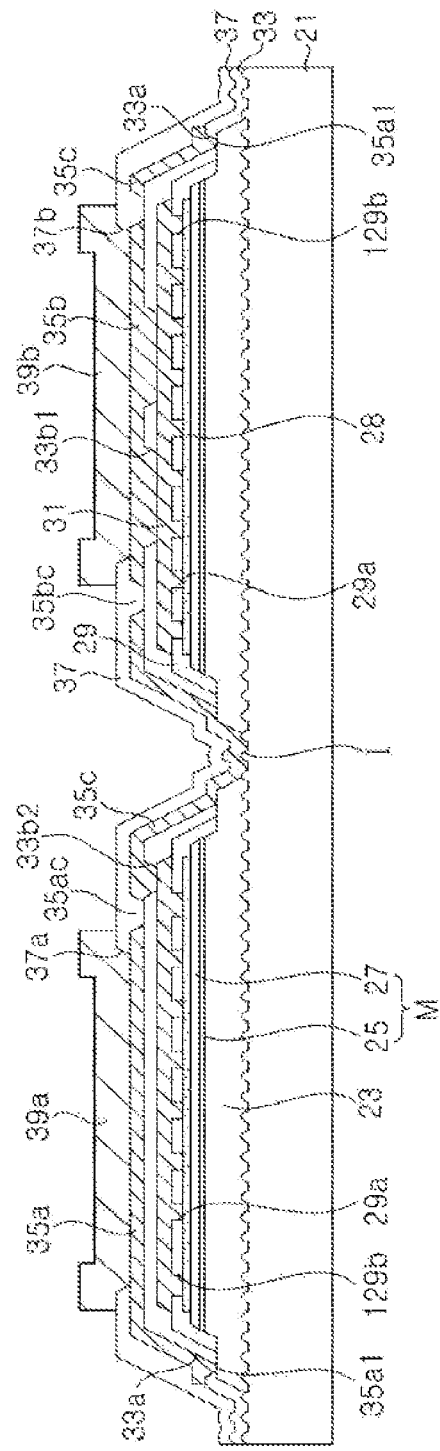
FIG. 14 is a cross-sectional view taken along the line C-C of FIG. 13.

FIG. 13 is a schematic plan view illustrating a light emitting diode according to another exemplary embodiment of the present disclosure, and FIG. 14 is a cross-sectional view taken along the line C-C of FIG. 13.

Referring to FIG. 13 and FIG. 14, the light emitting diode according to the exemplary embodiment is substantially similar to those in the above-described embodiments, but a plurality of light emitting cells C1 and C2 are formed and t connected in series in the exemplary embodiment.

First and second light emitting cells C1 and C2 are disposed on the substrate 21. The first and second light emitting cells C1 and C2 are separated from each other by an isolation region I exposing the substrate 21 (see FIG. 14). As such, semiconductor layers of the first light emitting cell C1 and the second light emitting cell C2 are spaced apart from each other. Each of the first and second light emitting cells C1 and C2 are disposed to face each other and may have a square or rectangular shape, respectively. In particular, the first and second light emitting cells C1 and C2 may have elongated rectangular shapes in a direction facing each other.

The isolation region I separates the light emitting cells C1 and C2 from each other. As such, a surface of the substrate 21 is exposed in the isolation region I through semiconductor layers. The isolation region I is formed using photolithography and etching processes, a photoresist pattern having a gentle inclined surface is formed and the semiconductor layers are etched using the photoresist pattern as a mask, thereby forming relatively gently inclined side surfaces in the isolation region I.

The light emitting cells C1 and C2 face each other with the isolation region I interposed therebetween. Side surfaces of the light emitting cells C1 and C2 that face each other are defined as inner side surfaces, and side surfaces of the light emitting cells other than the inner side surfaces are defined as outer side surfaces. Therefore, the first conductivity type semiconductor layers 23 in the first and second light emitting cells C1 and C2 also include inner and outer side surfaces, respectively. For example, the first conductivity type semiconductor layer 23 may include one inner side surface and three outer side surfaces.

A mesa M is disposed on each of first conductivity type semiconductor layers 23. The mesa M may be located within a region surrounded by the side surfaces of the first conductivity type semiconductor layer 23, and thus, regions near edges adjacent to the outer side surfaces of the first conductivity type semiconductor layer 23 are not covered by the mesa M, but are exposed to the outside. In another exemplary embodiment, a side surface of the mesa M and a side surface of the first conductivity type semiconductor layer 23 on a sidewall of the isolation region I may be continuous with each other.

Each mesa M includes a second conductivity type semiconductor layer 27 and an active layer 25. The active layer 25 is interposed between the first conductivity type semiconductor layer 23 and the second conductivity type semiconductor layer 27. Each mesa M has recesses, first openings 33a of a lower insulation layer 33 are formed in the recesses, which will be described later, and outer contact portions 35a1 are formed through the first openings 33a.

A conductive oxide layer 28 is disposed on each mesa M, and a dielectric layer 29 covers the conductive oxide layer 28 and the mesa M on each of the light emitting cells C1 and C2. The conductive oxide layer 28 is in ohmic contact with the second conductivity type semiconductor layer 27. The conductive oxide layer 28 may be disposed over almost an entire region of the mesa M in an upper region of the mesa M. However, the conductive oxide layer 28 may be spaced apart from an edge of the mesa M.

The dielectric layer 29 may cover the upper region and side surfaces of the mesa M, and may cover the first conductivity type semiconductor layer exposed around the mesa M. The dielectric layer 29 also has openings 29a and 129b, and the bar-shaped openings 129b are disposed between the outer contact portions 35a1 and the openings 29a. In the illustrated exemplary embodiment, the bar-shaped openings 129b are illustrated and described as an example, but in addition to the bar shape, circular, elliptical or other shape openings having a larger size than that of the openings 29a may be disposed, and a single line-shaped opening that continuously stretches out longitudinally may be disposed on each mesa M, as shown in FIGS. 13 and 14.

A metal reflection layer 31 is disposed on the dielectric layer 29 and connects to the conductive oxide layer 28 through the openings 29a and 129b of the dielectric layer 29. The metal reflection layer 31 is disposed in the upper region of the mesa M of each of the light emitting cells C1 and C2.

The lower insulation layer 33 covers the mesas M and covers the metal reflection layer 31 and the dielectric layer 29. The lower insulation layer 33 also covers the first conductivity type semiconductor layer 23 and the substrate 21 exposed to the outside of the dielectric layer 29. In a case that the substrate 21 is a patterned sapphire substrate, the lower insulation layer 33 may be formed along shapes of protrusions on the substrate 21.

The lower insulation layer 33 includes the first openings 33a exposing the first conductivity type semiconductor layer 23 in the recesses of each mesa M, and further includes second openings 33b1 exposing the metal reflection layer 31 on the second light emitting cell C2 and a third opening 33b2 exposing the metal reflection layer 31 on the first light emitting cell C1. The first openings 33a expose the first conductivity type semiconductor layer 23 along outer surfaces of the mesa M, and the third opening 33b2 exposes the metal reflection layer 31 on the first light emitting cell C1 near the isolation region I. The third openings 33b2 may generally have an elongated shape along the isolation region I, but they are not necessarily limited thereto, and may have various shapes.

The second openings 33b1 may be located on the second light emitting cell C2, and may be located in a lower region of a second bump pad 39b. However, in another exemplary embodiment, the second openings 33b1 may be disposed to be apart from the second bump pad 39b on the second light emitting cell C2 in the lateral direction. In FIG. 14, the lateral direction corresponds to a vertical direction.

A first pad metal layer 35a, a second pad metal layer 35b and a connection metal layer 35c are disposed on the lower insulation layer 33.

The first pad metal layer 35a is disposed on the first light emitting cell C1, and is in ohmic contact with the first conductivity type semiconductor layer 23 exposed around the mesa M. As shown in FIG. 13, the first pad metal layer 35a may be in ohmic contact with the first conductivity type semiconductor layer 23 through the first opening 33a of the lower insulation layer 33 along a periphery of the mesa M to form the outer contact portions 35a1. In the drawing, the first pad metal layer 35a intermittently contacts the first conductivity type semiconductor layer 23 in the recesses of the mesa M along the periphery of the mesa M, but is not limited thereto, and may remain contacting the first conductivity type semiconductor layer 23. More particularly, the lower insulation layer 33 may be formed to have the first opening 33a that causes the first conductivity type semiconductor layer 23 to be exposed along the periphery of the mesa M, and the first pad metal layer 35a may maintain contact with the first conductivity type semiconductor layer 23 through the first opening 33a of the lower insulation layer 33.

The bar-shaped openings 129b of the dielectric layer 29 may be flush with the first openings 33a of the lower insulation layer 33, and thus, may be flush with the outer contact portions 35a1.

The second pad metal layer 35b is disposed on the second light emitting cell C2 and is connected to the metal reflection layer 31 on the second light emitting cell C2 through the second opening 33b1 of the lower insulation layer 33. The second pad metal layer 35b is disposed on the mesa M, and is insulated from the first conductivity type semiconductor layer 23. For example, the second pad metal layer 35b may be separated from side surfaces of the mesa M on the second light emitting cell C2.

The connection metal layer 35c may be electrically connected to the metal reflection layer 31 on the first light emitting cell C1 through the third opening 33b2 of the lower insulation layer 33, and may be electrically connected to the first conductivity type semiconductor layer 23 of the second light emitting cell C2 through the first openings 33a of the second light emitting cell C2. Accordingly, the first and second light emitting cells C1 and C2 are connected to each other in series through the connection metal layer 35c.

The connection metal layer 35c may contact the first conductivity type semiconductor layer 23 in the recesses of the mesa M along the edge of the second light emitting cell C2 to form the outer contact portions 35a1. In particular, the connection metal layer 35c may contact the first conductivity type semiconductor layer 23 continuously or intermittently along the periphery of the mesa M. In addition, the connection metal layer 35c may surround the second pad metal layer 35b, and a boundary region 35bc may be formed between the connection metal layer 35c and the second pad metal layer 35b. Meanwhile, a boundary region 35ac may be formed between the connection metal layer 35c and the first pad metal layer 35a. The boundary regions 35ac and 35bc are covered with an upper insulation layer 37 which will be described later.

The first and second pad metal layers 35a and 35b and the connection metal layer 35c may be formed in the same process and may include substantially the same material. For example, the first and second pad metal layers 35a and 35b and the connection metal layer 35c may include an ohmic reflection layer such as an Al layer, and the ohmic reflection layer may be formed on an adhesive layer such as Ti, Cr, or Ni. Furthermore, a protective layer of a single layer or a multiple layer structure such as Ni, Cr, Au, or the like may be formed on the ohmic reflection layer. The first and second pad metal layers 35a and 35b and the connection metal layer 35c may have multilayer structures of Cr/Al/Ni/Ti/Ni/Ti/Au/Ti, for example.

The upper insulation layer 37 is disposed on the first pad metal layer 35a, the second pad metal layer 35b, and the connection metal layer 35c, and has a first opening 37a exposing the first pad metal layer 35a and a second opening 37b exposing the second pad metal layer 35b. The upper insulation layer 37 also covers the first pad metal layer 35a and the connection metal layer 35c connected to the first conductivity type semiconductor layer 23 in the periphery of the mesa M. As shown in FIG. 13, a region between the first pad metal layer and the second connection metal layer 35c and an edge of the first conductivity type semiconductor layer 23 is covered with the upper insulation layer 37. In addition, the upper insulation layer 37 may cover the connection metal layer 35c on the isolation region I, and may be formed to have irregularities according to a shape of the connection metal layer 35c. The upper insulation layer 37 protects the first and second pad metal layers 35a and 35b and the connection metal layer 35c from external environments such as moisture.

The first opening 37a is formed within an upper region of the first pad metal layer 35a, and thus is separated from the connection metal layer 35c and the third opening 33b2 of the lower insulation layer 33. The second opening 37b is also disposed limitedly on the second pad metal layer 35b, and is separated from the connection metal layer 35c.

In the exemplary embodiment, the first and second pad metal layers 35a and 35b exposed through the first and second openings 37a and 37b of the upper insulation layer 37 may serve as bonding pads to which the solder is directly bonded. Alternatively, as described with reference to FIGS. 1 and 2, the first and second bump pads 39a and 39b may cover the first and second pad metal layers 35a and 35b exposed through the first and second openings 37a and 37b of the upper insulation layer 37, respectively. The first and second bump pads 39a and 39b may be formed in the first and second openings 37a and 37b of the upper insulation layer 37, but the inventive concepts are not limited thereto, and the first and second bump pads 39a and 39b may cover and seal the first and second openings 37a and 37b.

Figure 15:
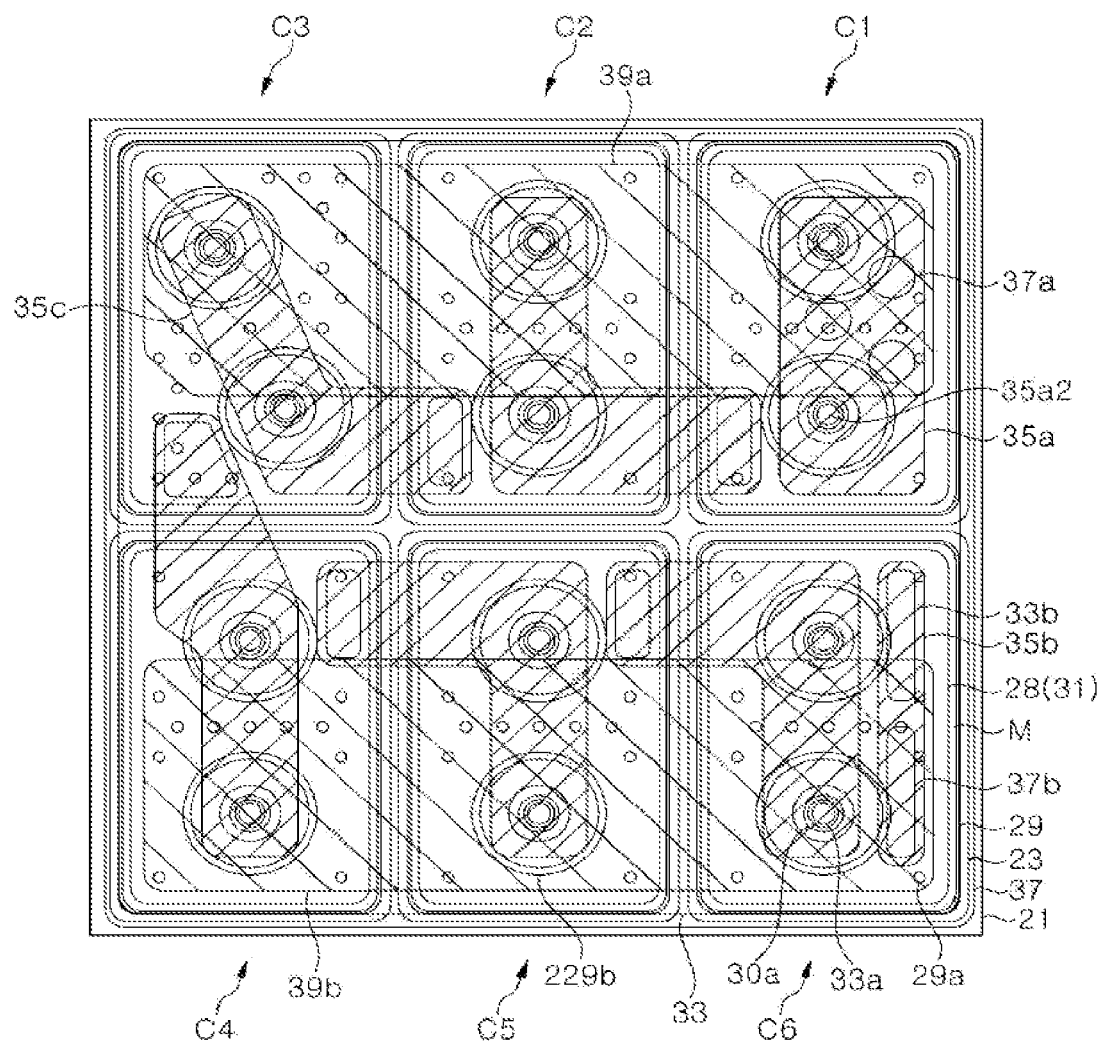
FIG. 15 is a schematic plan view illustrating a light emitting diode according to another exemplary embodiment.

FIG. 15 is a schematic plan view illustrating a light emitting diode according to another exemplary embodiment.

Referring to FIG. 15, the light emitting diode according to the exemplary embodiment includes six light emitting cells C1, C2, C3, C4, C5, and C6, and the light emitting cells are connected in series. Each of the light emitting cells C1 C2, C3, C4, C5, and C6 includes a first conductivity type semiconductor layer 23 and a mesa M as described with reference to FIG. 13, and is separated from one another by an isolation region.

Each mesa M has a via hole 30a exposing the first conductivity type semiconductor layer 23, and a lower insulation layer 33 has a first opening 33a exposing the first conductivity type semiconductor layer 23 in each via hole 30a. In addition, the lower insulation layer 33 has a second opening 33b exposing a metal reflection layer 31 on each light emitting cell.

A first pad metal layer 35a is disposed on the first light emitting cell C1 and forms inner contact portions 35a2 in the via holes 30a in the first light emitting cell C1. A second pad metal layer 35b is disposed on the last light emitting cell, that is, the sixth light emitting cell C6, and is connected to the metal reflection layer 31 through the second opening 33b. Connection metal layers 35c connect adjacent light emitting cells in series. The connection metal layers 35c electrically connect the metal reflection layer 31 of the adjacent light emitting cells and the first conductivity type semiconductor layer 23. The inner contact portions 35a2 are formed in the via holes 30a of the second, third, fourth, fifth, and sixth light emitting cells C2, C2, C3, C4, C5, and C6 by the connection metal layers 35c.

In the illustrated exemplary embodiment, the inner contact portions 35a2 are formed instead of outer contact portions 35a1, but the outer contact portions 35a1 may be formed.

In the exemplary embodiment, the dielectric layer 29 includes openings 229b together with openings 29a. The openings 29a are widely distributed on each mesa M. The openings 229b surround the inner contact portions 35a2 on each mesa M. The opening 229b is disposed between the inner contact portion 35a2 and the openings 29a. More particularly, the opening 229b is disposed closer to the inner contact portion 35a2 than the openings 29a. As such, it is possible to prevent device failure due to electrical overstress or electrostatic discharge from occurring in the opening adjacent to the inner contact portion 35a2.

A first bump pad 39a is disposed on the first light emitting cell C1 and a second bump pad 39b is disposed on the sixth light emitting cell C6. The first, second, third, fourth, fifth, and sixth light emitting cells C1, C2, C2, C3, C4, C5, and C6 are connected in series between the first bump pad 39a and the second bump pad 39b.

Figure 16:
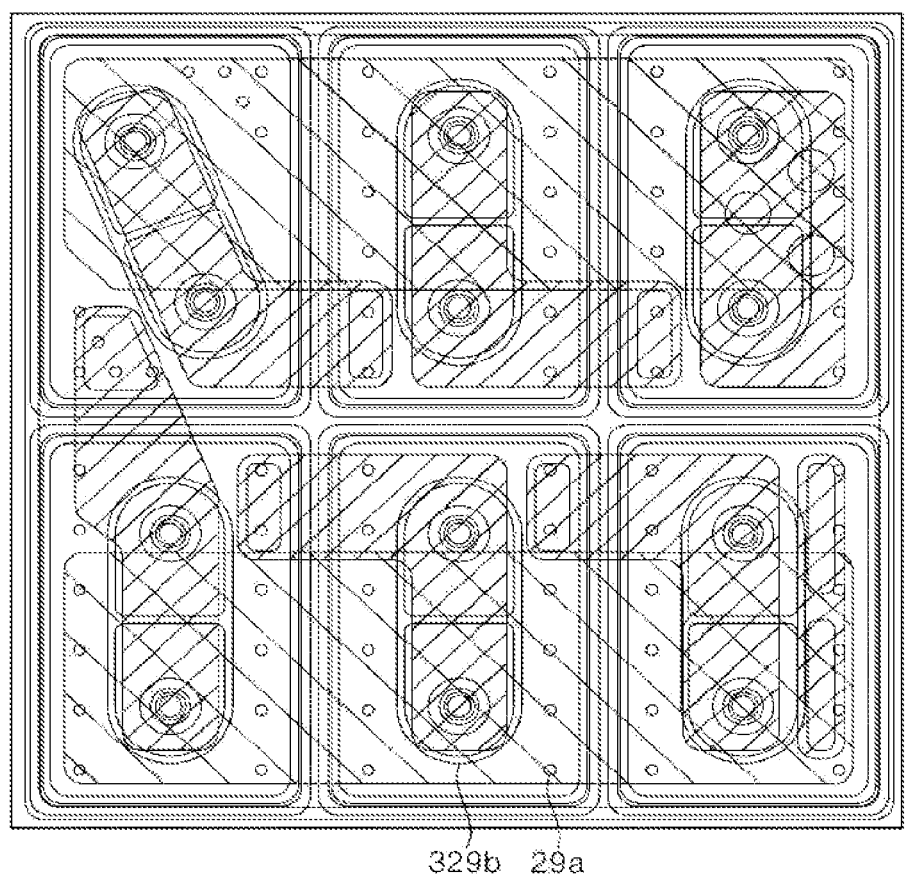
FIG. 16 is a schematic plan view illustrating a light emitting diode according to another exemplary embodiment.

In the illustrated exemplary embodiment, although the opening 229b is illustrated as having a ring shape surrounding the via hole 30a, the inventive concepts are not limited thereto. For example, the opening 229b may be formed in a portion of the outer periphery of the via hole 30a. However, the opening 229b may have a longer shape than the opening 29a. In another exemplary embodiment, openings 329b as shown in FIG. 16 may be formed by connecting the openings of the dielectric layer 29 surrounding the via holes 30a on each mesa M.

An Exemplary Experiment of Electrostatic Discharge

Electrostatic discharge characteristics of the light emitting diode (Comparative Example) in the exemplary embodiment of FIG. 9 in which the openings 29a are disposed adjacent to the external contacts 35a1 and those of the light emitting diodes (Examples 1, 2, 3, and 4) in the exemplary embodiments of FIGS. 9 through 12 are compared.

Sixteen (16) samples were prepared for each light emitting diode, and voltages from 1 kV to 6 kV were applied three times at 0.3 second intervals to determine whether device defects occurred. The voltage was increased in an increment of 1 kV from 1 kV to 4 kV, and increased in an increment of 0.5 kV from 4 kV to 6 kV.

As for the light emitting diodes of the Comparative Example, all of the light emitting diodes were defective due to electrostatic discharge at 4 kV, and, as for the light emitting diodes of Inventive Example 1 of FIG. 9, two device defects occurred at 4 kV and 14 device defects occurred at 4.5 kV.

As for the light emitting diodes of Inventive Example 2 of FIG. 10, two device defects occurred at 4.5 kV and 14 device defects occurred at 5 kV, and, as for the light emitting diodes of Inventive Example 3 of FIG. 6, one device defect occurred at 4.5 kV, six device defects occurred at 5 kV, and six device defects occurred at 5.5 kV.

As for the light emitting diodes of Inventive Example 4 of FIG. 12, one device defect occurred at 4.5 kV, seven device defects occurred at 5 kV, and eight device defects occurred at 5.5 kV.

The above experimental results are shown in Table 1 below.

TABLE 1

| | Number of Device Failure(Total 16 ea) | | | | | | | |
| --- | --- | --- | --- | --- | --- | --- | --- | --- |
| Applied voltage(kV) | 1 | 2 | 3 | 4 | 4.5 | 5 | 5.5 | 6 |
| Comparative example | — | — | — | 16 | | | | |
| Inventive example 1 | — | — | — | 2 | 14 | | | |
| Inventive example 2 | — | — | — | | 2 | 14 | | |
| Inventive example 3 | — | — | — | — | 1 | 6 | 6 | 3 |
| Inventive example 4 | — | — | — | 1 | — | — | 7 | 8 |

Referring to Table 1, it can be seen that the light emitting diodes of Examples 1, 2, 3, and 4 have stronger resistance to electrostatic discharge than that of Comparative Example, and in particular, the light emitting diode of Example 4 (FIG. 12) having an elongated bar-shaped opening has the strongest resistance to electrostatic discharge.

Figure 17:
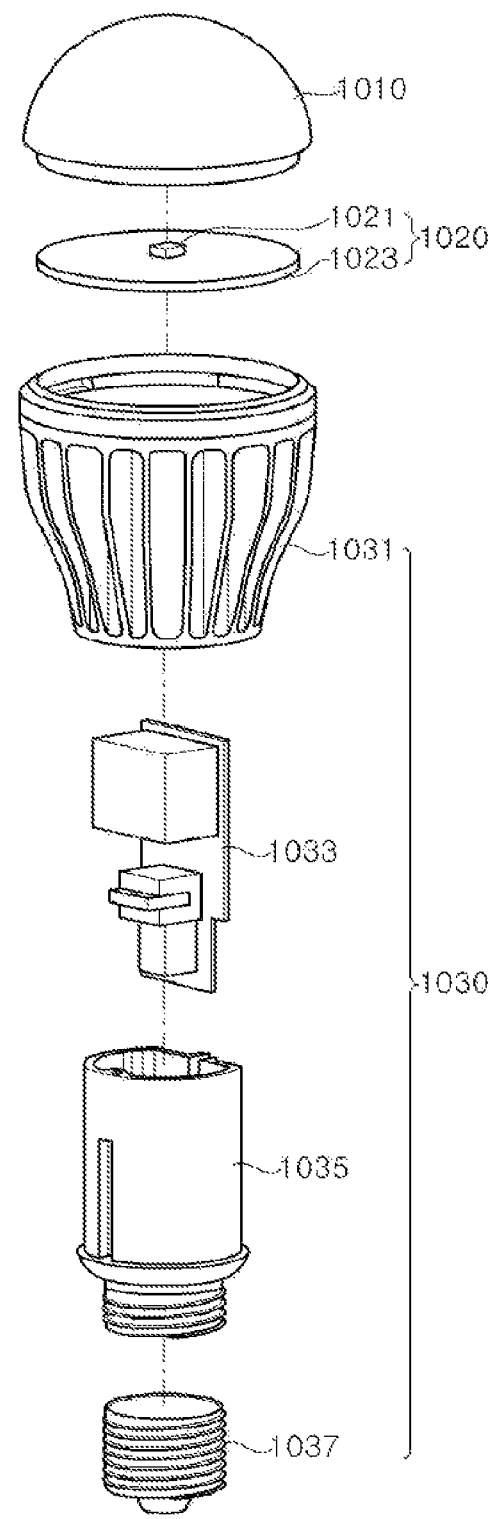
FIG. 17 is an exploded perspective view illustrating a lighting apparatus to which a light emitting diode according to an exemplary embodiment is applied.

FIG. 17 is an exploded perspective view illustrating a lighting apparatus to which a light emitting diode according to an exemplary embodiment is applied. Referring to FIG. 17, the lighting apparatus according to the exemplary embodiment includes a diffusive cover 1010, a light emitting diode module 1020, and a body 1030. The body 1030 may receive the light emitting diode module 1020 and the diffusive cover 1010 may be disposed on the body 1030 to cover an upper surface of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may include a light transmitting material and light orientation of the lighting apparatus may be adjusted through regulation of the shape and optical transmissivity of the diffusive cover 1010. Thus, the diffusive cover 1010 may be modified to have various shapes depending on usage and applications of the lighting apparatus.

Figure 18:
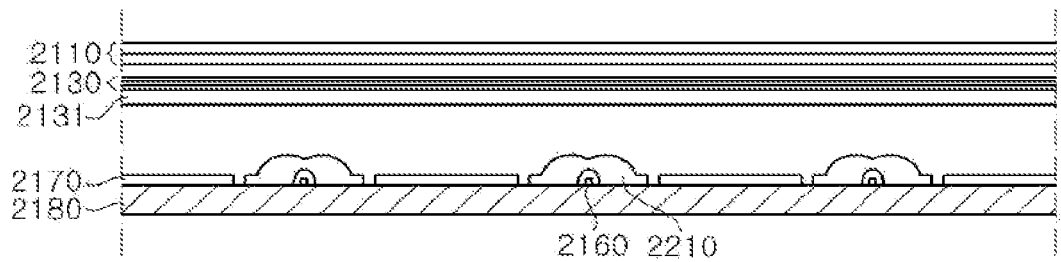
FIG. 18 is a cross-sectional view illustrating a display apparatus to which a light emitting diode according to another exemplary embodiment of the present disclosure is applied.

FIG. 18 is a cross-sectional view illustrating a display apparatus to which a light emitting diode according to another exemplary embodiment of the present disclosure is applied. The display apparatus according to the exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper surface thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged flush with one another, without being limited thereto. However, it should be understood that the backlight unit includes a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed above the light emitting diode 2160. Light emitted from the light emitting diodes 2160 may be supplied in the form of sheet light to the display panel 2110 through the diffusive plate 2131 and the optical sheets 2130.

In this way, the light emitting diodes according to the exemplary embodiments may be applied to direct type displays like the display apparatus according to the exemplary embodiment.

Figure 19:
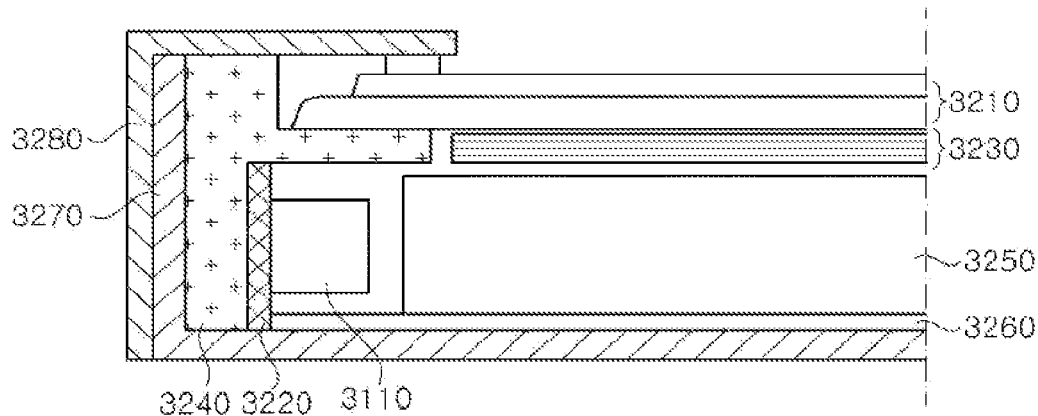
FIG. 19 is a cross-sectional view illustrating a display apparatus to which a light emitting diode according to another exemplary embodiment of the present disclosure is applied.

FIG. 19 is a cross-sectional view illustrating a display apparatus to which a light emitting diode according to another exemplary embodiment of the present disclosure is applied.

The display apparatus according to the exemplary embodiment includes a display panel 3210 on which an image is displayed, and a backlight unit disposed at a rear side of the display panel 3210 and emitting light thereto. Further, the display apparatus includes a frame 3240 supporting the display panel 3210 and receiving the backlight unit, and covers 3270, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3270, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper surface thereof, a light source module disposed at one side inside the lower cover 3270, and a light guide plate 3250 disposed flush with the light source module and converting spot light into sheet light. In addition, the backlight unit according to the exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display apparatus according to the exemplary embodiment.

Figure 20:
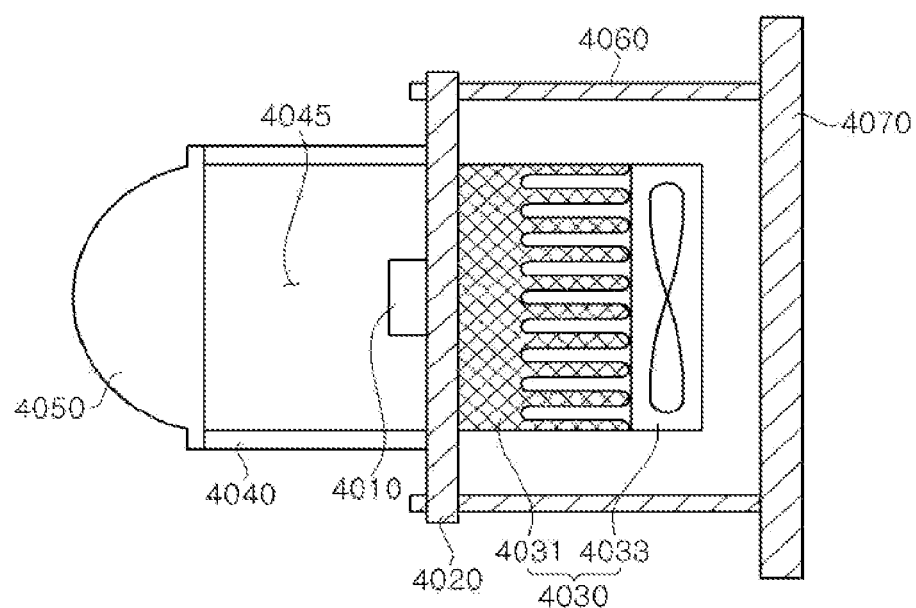
FIG. 20 is a cross-sectional view illustrating a head light to which a light emitting diode according to another exemplary embodiment of the present disclosure is applied.

FIG. 20 is a cross-sectional view illustrating a head light to which a light emitting diode according to another exemplary embodiment of the present disclosure is applied.

Referring to FIG. 20, the headlight according to the exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be separated from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 may include a light reflective material or coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiments may be applied to headlights like the headlight according to the exemplary embodiment, particularly, vehicular headlights.

Although the various embodiments of the present disclosure have been described above, the present disclosure is not limited to these embodiments, and various modifications can be made. In addition, the elements described in one embodiment can be applied to other embodiments without departing from the technical spirit according to the appended claims of the present disclosure.

The invention claimed is:

1. A light apparatus, comprising:
a controller;
a circuit board configured to receive an electrical signal from the controller,
a diffusion plate disposed on a light module, and
wherein the light module comprises light sources disposed on the circuit board, each of the light sources includes:
a first conductivity type semiconductor layer;
a mesa disposed on the first conductivity type semiconductor layer, and including an active layer and a second conductivity type semiconductor layer;
an ohmic layer disposed on the mesa and electrically connected to the second conductivity type semiconductor layer;
a reflection layer disposed on the ohmic layer;
a first pad metal layer disposed on and electrically connected to the first conductivity type semiconductor layer;
a second pad metal layer disposed on and electrically connected to the ohmic layer;
an upper insulation layer covering the mesa and including openings, and
a boundary region is between the first pad metal layer and the second pad metal layer,
wherein the upper insulation layer is disposed on the boundary region,
wherein the reflection layer alternately contacts with the ohmic layer, and
wherein a light emitted from the light sources passes through the diffusion plate.

2. The light apparatus of claim 1,
wherein the each of the light sources further includes a lower insulation layer disposed between the second conductivity type semiconductor layer and the second pad metal layer.

3. The light apparatus of claim 1,
wherein the each of the light sources further includes a lower insulation layer disposed between the first conductivity type semiconductor layer and the first pad metal layer, and the lower insulation layer has an opening to expose the first conductivity type semiconductor layer.

4. The light apparatus of claim 1,
wherein the first pad metal layer includes an extension region and an end terminal region having a wider width than a width of the extension region.

5. The light apparatus of claim 1,
wherein the mesa has an indent region having a round shape at a terminal of the indent region.

6. The light apparatus of claim 1,
wherein the second conductivity type semiconductor layer includes an impurity profile having a p-type, and the impurity profile has a region in which a concentration of a p-type impurity increases as closer to the ohmic layer.

7. The light apparatus of claim 1, further comprising a lower cover configured to support the circuit board, and the lower cover is open at an upper surface of the lower cover to dispose the circuit board.

8. A light apparatus, comprising:
a controller;

a circuit board configured to receive an electrical signal from the controller, an optical sheet disposed on a light module, and wherein the light module comprises light sources disposed on the circuit board, each of the light sources includes:

a first conductivity type semiconductor layer;

a mesa disposed on the first conductivity type semiconductor layer, and including an active layer and a second conductivity type semiconductor layer;

an ohmic layer disposed on the mesa and electrically connected to the second conductivity type semiconductor layer;

a reflection layer disposed on the ohmic layer;

a first pad metal layer disposed on and electrically connected to the first conductivity type semiconductor layer;

a second pad metal layer disposed on and electrically connected to the ohmic layer;

an upper insulation layer covering the mesa and including openings, and wherein a boundary region is disposed between the first pad metal layer and the second pad metal layer, wherein the upper insulation layer is disposed on the boundary region, wherein the reflection layer alternately contacts with the ohmic layer, and wherein the light sources are configured to supply a light to the optical sheet.

9. The light apparatus of claim 8, wherein the each of the light sources further includes a lower insulation layer disposed between the second conductivity type semiconductor layer and the second pad metal layer.

10. The light apparatus of claim 8, wherein the each of the light sources further includes a lower insulation layer disposed between the first conductivity type semiconductor layer and the first pad metal layer, and the lower insulation layer has an opening to expose the first conductivity type semiconductor layer.

11. The light apparatus of claim 8, wherein the first pad metal layer includes an extension region and an end terminal region having a wider width than a width of the extension region.

12. The light apparatus of claim 8, wherein the mesa has an indent region having a round shape at a terminal of the indent region.

13. The light apparatus of claim 8, wherein the second conductivity type semiconductor layer includes an impurity profile having a p-type, and the impurity profile has a region in which a concentration of a p-type impurity increases as closer to the ohmic layer.

14. The light apparatus of claim 8, further comprising a lower cover configured to support the circuit board, and the lower cover is open at an upper surface of the lower cover to dispose the circuit board.

15. A light apparatus, comprising:

a controller;

a circuit board configured to receive an electrical signal from the controller, a cover configured to support a light module, and wherein the light module includes light sources disposed on the circuit board, each of the light sources includes:

a first conductivity type semiconductor layer;

a mesa disposed on the first conductivity type semiconductor layer, and including an active layer and a second conductivity type semiconductor layer;

an ohmic layer disposed on the mesa and electrically connected to the second conductivity type semiconductor layer;

a reflection layer disposed on the ohmic layer;

a first pad metal layer disposed on and electrically connected to the first conductivity type semiconductor layer;

a second pad metal layer disposed on and electrically connected to the ohmic layer;

an upper insulation layer covering the and including openings, and wherein a boundary region is between the first pad metal layer and the second pad metal layer, wherein the upper insulation layer is disposed on the boundary region, and wherein the reflection layer alternately contacts with the ohmic layer.

16. The light apparatus of claim 15, wherein the each of the light sources further includes a lower insulation layer disposed between the second conductivity type semiconductor layer and the second pad metal layer.

17. The light apparatus of claim 15, wherein the each of the light sources further includes a lower insulation layer disposed between the first conductivity type semiconductor layer and the first pad metal layer, and the lower insulation layer has an opening to expose the first conductivity type semiconductor layer.

18. The light apparatus of claim 15, wherein the first pad metal layer includes an extension region and an end terminal region having a wider width than a width of the extension region.

19. The light apparatus of claim 15, wherein the mesa has an indent region having a round shape at a terminal of the indent region.

20. The light apparatus of claim 15, wherein the second conductivity type semiconductor layer includes an impurity profile having a p-type, and the impurity profile has a region in which a concentration of a p-type impurity increases as closer to the ohmic layer.

* * * * *